United States Patent
Wiedeman et al.

(10) Patent No.: US 9,385,254 B2
(45) Date of Patent: Jul. 5, 2016

(54) INTEGRATED THIN FILM SOLAR CELL INTERCONNECTION

(71) Applicants: GLOBAL SOLAR ENERGY, INC., Tucson, AZ (US); HANERGY HI-TECH POWER (HK) LIMITED, West KL (HK)

(72) Inventors: Scott Wiedeman, Tucson, AZ (US); Eric Sheehan, Tucson, AZ (US); Jeffrey S. Britt, Tucson, AZ (US)

(73) Assignee: Hanergy Hi-Tech Power (HK) Limited, West KL (HK)

( * ) Notice: Subject to any disclaimer, the term of this patent is extended or adjusted under 35 U.S.C. 154(b) by 604 days.

(21) Appl. No.: 13/865,099

(22) Filed: Apr. 17, 2013

(65) Prior Publication Data
US 2013/0269748 A1    Oct. 17, 2013

Related U.S. Application Data

(60) Provisional application No. 61/625,553, filed on Apr. 17, 2012.

(51) Int. Cl.
*B23P 15/26* (2006.01)
*H01L 31/05* (2014.01)
(Continued)

(52) U.S. Cl.
CPC ...... *H01L 31/0508* (2013.01); *H01L 31/03926* (2013.01); *H01L 31/044* (2014.12);
(Continued)

(58) Field of Classification Search
CPC ............. H01L 31/0508; H01L 31/044; H01L 31/0445; H01L 31/03926; H01L 31/048; H01L 31/0749; H01L 31/1876; Y10T 29/49002; Y10T 29/49; Y10T 29/49117; Y10T 29/49124; Y10T 29/49355; Y02P 70/521; Y02E 10/541
USPC ............ 29/890.033, 890.03, 592, 825, 592.1; 136/244; 438/66
See application file for complete search history.

(56) References Cited

U.S. PATENT DOCUMENTS 3,553,030 A    1/1971    Lebrun
4,064,552 A    12/1977   Angelucci et al.
(Continued)

FOREIGN PATENT DOCUMENTS

DE    3423172 A1    1/1985
DE    19652810 A1   7/1998
(Continued)

OTHER PUBLICATIONS

Sep. 15, 2014, Extended European Search Report from The European Patent Office, in European Patent Application No. 10844268.2, which is another application of Applicant Hanergy Hi-Tech Power (HK) Limited.
Oct. 30, 2014, International Preliminary Report on Patentability from The International Bureau of WIPO, in PCT/US2013/037024, which is an international patent application of Hanergy Hi-Tech Power (HK) Limited.

(Continued)

*Primary Examiner* — Peter DungBa Vo
*Assistant Examiner* — Azm Parvez
(74) *Attorney, Agent, or Firm* — Kolisch Hartwell, P.C.

(57) ABSTRACT

Photovoltaic modules may include multiple flexible thin film photovoltaic cells electrically connected in series, and laminated to a substantially transparent top sheet having a conductive grid pattern facing the cells. Methods of manufacturing photovoltaic modules including integrated multi-cell interconnections are provided. Methods may include steps of coordinating, integrating, and registering multiple rolls of substrates in continuous processes.

6 Claims, 13 Drawing Sheets

(51) Int. Cl.
  *H01L 31/18*    (2006.01)
  *H01L 31/0392*  (2006.01)
  *H01L 31/048*   (2014.01)
  *H01L 31/0749*  (2012.01)
  *H01L 31/044*   (2014.01)
  *H01L 31/0445*  (2014.01)

(52) U.S. Cl.
  CPC .......... *H01L31/048* (2013.01); *H01L 31/0445* (2014.12); *H01L 31/0749* (2013.01); *H01L 31/1876* (2013.01); *Y02E 10/541* (2013.01); *Y02P 70/521* (2015.11)

(56) References Cited

U.S. PATENT DOCUMENTS

| | | |
|---|---|---|
| 4,221,465 A | 9/1980 | Hannan et al. |
| 4,254,546 A | 3/1981 | Ullery, Jr. |
| 4,318,938 A | 3/1982 | Barnett et al. |
| 4,400,577 A | 8/1983 | Spear |
| 4,430,519 A | 2/1984 | Young |
| 4,537,838 A | 8/1985 | Jetter et al. |
| 4,542,255 A | 9/1985 | Tanner et al. |
| 4,574,160 A | 3/1986 | Cull et al. |
| 4,609,770 A | 9/1986 | Nishiura et al. |
| 4,617,420 A | 10/1986 | Dilts et al. |
| 4,617,421 A | 10/1986 | Nath et al. |
| 4,642,413 A | 2/1987 | Ovshinsky |
| 4,652,693 A | 3/1987 | Bar-On |
| 4,663,828 A | 5/1987 | Hanak |
| 4,663,829 A | 5/1987 | Hartman et al. |
| 4,697,041 A | 9/1987 | Okaniwa et al. |
| 4,698,455 A | 10/1987 | Cavicchi et al. |
| 4,713,493 A | 12/1987 | Ovshinsky |
| 4,737,379 A | 4/1988 | Hudgens et al. |
| 4,746,618 A | 5/1988 | Nath et al. |
| 4,773,944 A | 9/1988 | Nath et al. |
| 4,783,421 A | 11/1988 | Carlson et al. |
| 4,888,061 A | 12/1989 | Wenz |
| 4,965,655 A | 10/1990 | Grimmer et al. |
| 5,021,099 A | 6/1991 | Kim et al. |
| 5,118,361 A | 6/1992 | Fraas et al. |
| 5,127,964 A | 7/1992 | Hamakawa et al. |
| 5,176,758 A | 1/1993 | Nath et al. |
| 5,181,968 A | 1/1993 | Nath et al. |
| 5,185,042 A | 2/1993 | Ferguson |
| 5,254,179 A | 10/1993 | Ricaud et al. |
| 5,268,037 A | 12/1993 | Glatfelter |
| 5,273,608 A | 12/1993 | Nath |
| 5,385,848 A | 1/1995 | Grimmer |
| 5,391,235 A | 2/1995 | Inoue |
| 5,409,549 A | 4/1995 | Mori |
| 5,419,781 A | 5/1995 | Hamakawa et al. |
| 5,457,057 A | 10/1995 | Nath et al. |
| 5,460,659 A | 10/1995 | Krut |
| 5,474,621 A | 12/1995 | Barnard |
| 5,534,094 A | 7/1996 | Arjavalingam et al. |
| 5,547,516 A | 8/1996 | Luch |
| 5,681,402 A | 10/1997 | Ichinose et al. |
| 5,728,230 A | 3/1998 | Komori et al. |
| 5,735,966 A | 4/1998 | Luch |
| 5,759,291 A | 6/1998 | Ichinose et al. |
| 5,928,437 A | 7/1999 | Dillard |
| 6,148,570 A | 11/2000 | Dinwoodie et al. |
| 6,239,352 B1 | 5/2001 | Luch |
| 6,248,948 B1 | 6/2001 | Nakagawa et al. |
| 6,310,281 B1 | 10/2001 | Wendt et al. |
| 6,372,538 B1 | 4/2002 | Wendt et al. |
| 6,414,235 B1 | 7/2002 | Luch |
| 6,459,032 B1 | 10/2002 | Luch |
| 6,479,744 B1 | 11/2002 | Tsuzuki et al. |
| 6,653,718 B2 | 11/2003 | Leung et al. |
| 6,690,041 B2 | 2/2004 | Armstrong et al. |
| 6,706,963 B2 | 3/2004 | Gaudiana et al. |
| 6,803,513 B2 | 10/2004 | Beernink et al. |
| 7,122,398 B1 | 10/2006 | Pichler |
| 7,176,543 B2 | 2/2007 | Beernink |
| 7,194,197 B1 | 3/2007 | Wendt et al. |
| 7,256,140 B2 | 8/2007 | Call et al. |
| 7,276,724 B2 | 10/2007 | Sheats et al. |
| 7,365,266 B2 | 4/2008 | Heckeroth |
| 7,432,438 B2 | 10/2008 | Rubin et al. |
| 7,485,474 B2 | 2/2009 | Call et al. |
| 7,498,508 B2 | 3/2009 | Rubin et al. |
| 7,507,903 B2 | 3/2009 | Luch |
| 7,517,465 B2 | 4/2009 | Guha et al. |
| 7,612,283 B2 * | 11/2009 | Toyomura ......... H01L 31/02021 136/244 |
| 7,635,810 B2 | 12/2009 | Luch |
| 7,638,353 B2 | 12/2009 | Beernink et al. |
| 7,732,243 B2 | 6/2010 | Luch |
| 7,851,700 B2 | 12/2010 | Luch |
| 7,868,249 B2 | 1/2011 | Luch |
| 7,898,053 B2 | 3/2011 | Luch |
| 7,898,054 B2 | 3/2011 | Luch |
| 7,932,124 B2 | 4/2011 | Brabec et al. |
| 7,964,476 B2 | 6/2011 | Liu et al. |
| 7,989,692 B2 | 8/2011 | Luch |
| 7,989,693 B2 | 8/2011 | Luch |
| 8,062,922 B2 | 11/2011 | Britt et al. |
| 8,076,568 B2 | 12/2011 | Luch et al. |
| 8,110,737 B2 | 2/2012 | Luch |
| 8,114,702 B2 | 2/2012 | Gilman |
| 8,138,413 B2 | 3/2012 | Luch et al. |
| 8,198,696 B2 | 6/2012 | Luch |
| 8,202,368 B2 | 6/2012 | Britt et al. |
| 8,222,513 B2 | 7/2012 | Luch |
| 8,304,646 B2 | 11/2012 | Luch |
| 8,319,097 B2 | 11/2012 | Luch |
| 8,759,664 B2 | 6/2014 | Kanto et al. |
| 8,993,364 B2 | 3/2015 | Wiedeman et al. |
| 9,236,513 B2 | 1/2016 | Wiedeman et al. |
| 2001/0015220 A1 | 8/2001 | Benz et al. |
| 2003/0121228 A1 | 7/2003 | Stoehr et al. |
| 2003/0127128 A1 | 7/2003 | Fabick et al. |
| 2003/0213974 A1 | 11/2003 | Armstrong et al. |
| 2004/0069340 A1 | 4/2004 | Luch |
| 2005/0000561 A1 | 1/2005 | Baret et al. |
| 2005/0045379 A1 | 3/2005 | Sakurai et al. |
| 2005/0121067 A1 | 6/2005 | Toyomura et al. |
| 2005/0176270 A1 | 8/2005 | Luch |
| 2005/0284517 A1 | 12/2005 | Shinohara |
| 2006/0032752 A1 | 2/2006 | Luch |
| 2006/0157103 A1 | 7/2006 | Sheats et al. |
| 2006/0174930 A1 | 8/2006 | Murphy et al. |
| 2006/0180195 A1 | 8/2006 | Luch |
| 2007/0095384 A1 | 5/2007 | Farquhar et al. |
| 2007/0253686 A1 | 11/2007 | Wendt et al. |
| 2007/0283996 A1 | 12/2007 | Hachtmann et al. |
| 2007/0283997 A1 | 12/2007 | Hachtmann et al. |
| 2008/0011350 A1 | 1/2008 | Luch |
| 2008/0023069 A1 | 1/2008 | Terada et al. |
| 2008/0053512 A1 | 3/2008 | Kawashima |
| 2008/0090022 A1 | 4/2008 | Ovshinsky |
| 2008/0099063 A1 | 5/2008 | Armstrong et al. |
| 2008/0121265 A1 | 5/2008 | Hishida et al. |
| 2008/0128013 A1 | 6/2008 | Lopatin et al. |
| 2008/0202577 A1 | 8/2008 | Hieslmair |
| 2008/0227236 A1 | 9/2008 | Luch |
| 2008/0257399 A1 | 10/2008 | Wong et al. |
| 2008/0314433 A1 | 12/2008 | Luch |
| 2009/0014058 A1 | 1/2009 | Croft et al. |
| 2009/0107538 A1 | 4/2009 | Luch |
| 2009/0111206 A1 | 4/2009 | Luch |
| 2009/0145551 A1 | 6/2009 | Luch |
| 2009/0163374 A1 | 6/2009 | Pawlak et al. |
| 2009/0169722 A1 | 7/2009 | Luch |
| 2009/0173374 A1 | 7/2009 | Luch |
| 2009/0223552 A1 | 9/2009 | Luch |
| 2009/0255469 A1 | 10/2009 | Britt et al. |
| 2009/0255565 A1 | 10/2009 | Britt et al. |
| 2009/0269877 A1 | 10/2009 | Pinarbasi et al. |
| 2009/0272436 A1 | 11/2009 | Cheung |
| 2009/0293941 A1 | 12/2009 | Luch |

(56) References Cited

U.S. PATENT DOCUMENTS

| | | |
|---|---|---|
| 2009/0314330 A1 | 12/2009 | Saha et al. |
| 2010/0108118 A1 | 5/2010 | Luch |
| 2010/0131108 A1 | 5/2010 | Meyer |
| 2010/0147356 A1 | 6/2010 | Britt |
| 2010/0193367 A1 | 8/2010 | Luch |
| 2010/0218824 A1 | 9/2010 | Luch |
| 2010/0224230 A1 | 9/2010 | Luch et al. |
| 2010/0229942 A1 | 9/2010 | Luch |
| 2010/0269902 A1 | 10/2010 | Luch et al. |
| 2010/0313946 A1 | 12/2010 | Higuchi et al. |
| 2011/0056537 A1 | 3/2011 | Luch |
| 2011/0067754 A1 | 3/2011 | Luch |
| 2011/0070678 A1 | 3/2011 | Luch |
| 2012/0000502 A1* | 1/2012 | Wiedeman ............ H01L 31/048 136/244 |
| 2012/0000510 A1 | 1/2012 | Wiedeman et al. |
| 2012/0006378 A1 | 1/2012 | Kanto et al. |
| 2012/0171802 A1 | 7/2012 | Luch et al. |
| 2012/0322194 A1 | 12/2012 | Luch |
| 2013/0037074 A1 | 2/2013 | Britt et al. |
| 2013/0052769 A1 | 2/2013 | Luch |
| 2013/0240011 A1 | 9/2013 | Luch |
| 2013/0255744 A1 | 10/2013 | Luch |
| 2013/0255746 A1 | 10/2013 | Luch et al. |
| 2013/0255771 A1 | 10/2013 | Luch |
| 2014/0137928 A1 | 5/2014 | Wiedeman et al. |
| 2014/0170798 A1 | 6/2014 | Wiedeman et al. |
| 2014/0213013 A1 | 7/2014 | Britt et al. |

FOREIGN PATENT DOCUMENTS

| | | |
|---|---|---|
| DE | 19814780 A1 | 7/1999 |
| DE | 212009000025 U1 | 10/2010 |
| DE | 102009020482 A1 | 11/2010 |
| EP | 0111394 A2 | 6/1984 |
| JP | 51-110985 A | 9/1976 |
| WO | 2005077062 A2 | 8/2005 |
| WO | 2009006230 A2 | 1/2009 |
| WO | 2009097161 A1 | 8/2009 |
| WO | 2010039245 A1 | 4/2010 |
| WO | 2011090723 A2 | 7/2011 |
| WO | 2013158796 A1 | 10/2013 |

OTHER PUBLICATIONS

Schwertheim et al., "Lead-free electrical conductive adhesives for solar cell interconnectors", Aug. 29, 2008, received from http://www.fernunihagen.de/LGBE/papers/2007/revpaper.pdf on Dec. 7, 2009, 3 pages.

U.S. Receiving Office, International Search Report and Written Opinion of the International Searching Authority regarding PCT Patent Application No. PCT/US2009/000690, Apr. 3, 2009, 8 pages.

U.S. Receiving Office, International Search Report and Written Opinion of the International Searching Authority regarding PCT Patent Application No. PCT/US2009/005418, Dec. 17, 2009, 7 pages.

The International Bureau of WIPO, International Preliminary Report on Patentability regarding PCT Patent Application No. PCT/US2009/000690, Aug. 3, 2010, 7 pages.

U.S. Receiving Office, International Search Report and Written Opinion of the International Searching Authority regarding PCT Patent Application No. PCT/US2010/062253, Mar. 29, 2011, 12 pages.

U.S. Patent and Trademark Office, Office action regarding U.S. Appl. No. 12/364,440, Apr. 5, 2011, 17 pages.

The International Bureau of WIPO, International Preliminary Report on Patentability regarding PCT Patent Application No. PCT/US2009/005418, Apr. 5, 2011, 6 pages.

U.S. Patent and Trademark Office, Office action regarding U.S. Appl. No. 12/364,440, Nov. 29, 2011, 18 pages.

U.S. Receiving Office, International Search Report and Written Opinion of the International Searching Authority regarding PCT Patent Application No. PCT/US2010/062259, May 2, 2012, 16 pages.

The International Bureau of WIPO, International Preliminary Report on Patentability regarding PCT Patent Application No. PCT/US2010/062253, Jul. 4, 2012, 8 pages.

The International Bureau of WIPO, International Preliminary Report on Patentability regarding PCT Patent Application No. PCT/US2010/062259, Jul. 4, 2012, 12 pages.

U.S. Patent and Trademark Office, Office action regarding U.S. Appl. No. 12/587,111, Aug. 28, 2012, 20 pages.

U.S. Patent and Trademark Office, Office action regarding U.S. Appl. No. 12/980,201, Dec. 6, 2012, 20 pages.

U.S. Patent and Trademark Office, Office action regarding U.S. Appl. No. 12/980,151, Dec. 13, 2012, 25 pages.

U.S. Patent and Trademark Office, Office action regarding U.S. Appl. No. 12/976,911, Jan. 9, 2013, 23 pages.

U.S. Patent and Trademark Office, Office action regarding U.S. Appl. No. 12/587,111, Mar. 14, 2013, 21 pages.

U.S. Patent and Trademark Office, Office action regarding U.S. Appl. No. 13/278,584, May 14, 2013, 8 pages.

U.S. Patent and Trademark Office, Office action regarding U.S. Appl. No. 12/976,911, Jul. 5, 2013, 13 pages.

U.S. Patent and Trademark Office, Office action regarding U.S. Appl. No. 12/980,201 Jul. 15, 2013, 25 pages.

U.S. Patent and Trademark Office, Office action regarding U.S. Appl. No. 12/980,151, Jul. 31, 2013, 19 pages.

U.S. Receiving Office, International Search Report and Written Opinion of the International Searching Authority regarding PCT Patent Application No. PCT/US2013/037024, Aug. 13, 2013, 13 pages.

Oct. 30, 2015, Extended European Search Report from the European Patent Office, in European Patent Application No. 13777853.6, which is a foreign patent application that shares the same priority as this U.S. application.

Dec. 24, 2013, Office action from the U.S. Patent and Trademark Office, in U.S. Appl. No. 13/482,699, which is another patent application of Global Solar Energy, Inc.

Jun. 17, 2015, Examination Report from The European Patent Office, in European Patent Application No. 108442682, which is another application of Applicant Hanergy Hi-Tech Power (HK) Limited.

May 14, 2014, International Search Report of the International Search Authority from the U.S. Receiving Office, in PCT/US2014/013348, which is an international application of Applicant Hanergy Hi-Tech Power (HK) Limited.

May 14, 2014, Written Opinion of the International Search Authority from the U.S. Receiving Office, in PCT/US2014/013348, which is an international application of Applicant Hanergy Hi-Tech Power (HK) Limited.

Aug. 6, 2015, International Preliminary Report on Patentability from the International Bureau of WIPO, in PCT/US2014/013348, which is an international patent application of Hanergy Hi-Tech Power (HK) Limited.

Aug. 25, 2015, First Action Interview Pilot Program Pre-Interview Communication from the U.S. Patent and Trademark Office, in U.S. Appl. No. 14/166,223, which is another application of Applicant Hanergy Hi-Tech Power (HK) Limited.

Sep. 23, 2015, Office action from the U.S. Patent and Trademark Office, in U.S. Appl. No. 14/671,937, which is another application of Applicant Hanergy Hi-Tech Power (HK) Limited.

Jan. 26, 2016, Office action from the U.S. Patent and Trademark Office in U.S. Appl. No. 14/932,059, which is another application owned by a subsidiary of applicant Hanergy Hi-Tech Power (HK) Limited, Apollo Precision Fujian Limited.

Apr. 6, 2016, Office action from the U.S. Patent and Trademark Office in U.S. Appl. No. 14/869,528, which is another application of applicant Hanergy Hi-Tech Power (HK) Limited.

Apr. 7, 2016, First Action Interview Pilot Program Pre-Interview Communication from the U.S Patent and Trademark Office in U.S. Appl. No. 14/165,933, which is another application of applicant Hanergy Hi-Tech Power (HK) Limited.

* cited by examiner

INTEGRATED THIN FILM SOLAR CELL INTERCONNECTION

CROSS-REFERENCE TO RELATED APPLICATION

This application claims priority from U.S. Provisional Patent Application Ser. No. 61/625,553, filed Apr. 17, 2012, which is hereby incorporated herein by reference. Also incorporated by reference in their entireties are the following patents and patent applications: U.S. Pat. Nos. 8,062,922, 7,194,197, 6,690,041, 6,372,538, 6,310,281, U.S. Patent Appl. Pub. No. 2012/0000502.

BACKGROUND

The field of photovoltaics generally relates to multi-layer materials that convert sunlight directly into DC electrical power. The basic mechanism for this conversion is the photovoltaic effect, first observed by Antoine-César Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates. Additional details relating to the composition and manufacture of thin film PV cells of a type suitable for use with the presently disclosed methods and apparatus may be found, for example, in U.S. Pat. Nos. 6,310, 281, 6,372,538, and 7,194,197, all to Wendt et al., and U.S. Pat. No. 8,062,922 to Britt et al.

As noted previously, a significant number of PV cells often are connected in series to achieve a usable voltage, and thus a desired power output. Such a configuration is often called a "string" of PV cells. Due to the different properties of crystalline substrates and flexible thin film substrates, the electrical series connection between cells may be constructed differently for a thin film cell than for a crystalline cell, and forming reliable series connections between thin film cells poses several challenges. For example, soldering (the traditional technique used to connect crystalline solar cells) directly on thin film cells exposes the PV coatings of the cells to damaging temperatures, and the organic-based silver inks typically used to form a collection grid on thin film cells may not allow strong adherence by ordinary solder materials in any case. Thus, PV cells often are joined with wires or conductive tabs attached to the cells with an electrically conductive adhesive (ECA), rather than by soldering.

However, even when wires or tabs are used to form intercell connections, the extremely thin coatings and potential flaking along cut PV cell edges introduces opportunities for shorting (power loss) wherever a wire or tab crosses over a cell edge. Furthermore, the conductive substrate on which the PV coatings are deposited, which typically is a metal foil, may be easily deformed by thermo-mechanical stress from attached wires and tabs. This stress can be transferred to weakly-adhering interfaces, which can result in delamination of the cells. In addition, adhesion between the ECA and the cell back side, or between the ECA and the conductive grid on the front side, can be weak, and mechanical stress may cause separation of the wires or tabs at these locations. Also, corrosion can occur between the molybdenum or other coating on the back side of a cell and the ECA that joins the tab to the solar cell there. This corrosion may result in a high-resistance contact or adhesion failure, leading to power losses.

Advanced methods of joining thin film PV cells with conductive tabs or ribbons may largely overcome the problems of electrical shorting and delamination, but may require undesirably high production costs to do so. Furthermore, all such methods—no matter how robust—require that at least some portion of the PV string be covered by a conductive tab, which blocks solar radiation from striking that portion of the string and thus reduces the efficiency of the system. As a result, there is a need for improved methods of interconnecting PV cells into strings, and for improved strings of interconnected cells. Specifically, there is a need for strings and methods of their formation that reduce interconnection costs and reduce the fraction of each PV cell that is covered by the interconnection mechanism, while maintaining or improving the ability of the cell to withstand stress.

SUMMARY

Photovoltaic module configurations include multiple flexible thin film photovoltaic cells electrically connected in series, and laminated to a substantially transparent top sheet having a conductive grid pattern facing the cells. A portion of the photoactive composition of each cell may be removed to expose the underlying conductive substrate, allowing cells to be interconnected by electrically connecting the conductive grid pattern contacting the top surface of one cell with the top side of the conductive substrate of an adjacent cell.

Methods of manufacturing photovoltaic modules including integrated multi-cell interconnections are also described. Methods include steps of electrically isolating certain portions of cells to facilitate interconnection of the cells, by obliterating, removing or otherwise modifying photoactive material in cells to expose the underlying conductive substrate in certain regions, or to render the photoactive material sufficiently electrically conductive to form electrical connections with the conductive substrate. For example, methods according to the present teachings may include applying a conductive grid pattern to an optically transparent top sheet, aligning cells with the top sheet, and laser welding or otherwise securing the cells to the top sheet in the proper configuration. Laser welding may convert existing semiconductor material into material having low ohmic resistance (for example, resistance of 0.1 milliohms-cm$^2$ or less), thus allowing an electrical connection between the conductive grid pattern and the conductive substrate of the cell to which it is welded.

Numerous other devices, intermediate articles and methods of manufacture will be apparent from the detailed description below and related figures.

DETAILED DESCRIPTION

Methods and apparatus for interconnecting flexible, thin-film photovoltaic (PV) cells in a scalable, efficient process, are provided. More specifically, examples of the present teachings relate to a roll-to-roll assembly of flexible PV cells on a flexible current-carrying back sheet. The back sheet may be a conductive substrate on which photoactive materials have been deposited.

According to the present teachings, systems and methods of interconnecting thin-film photovoltaic cells in a flexible substrate package may include a series of photovoltaic cells and a transparent top sheet covering the cells. Electrically-conductive pathways are established connecting a top or "sunny" side of one cell to the top of the conductive substrate underlying the photoactive material of an adjacent cell. Portions of the photoactive material of the interconnected cells may be scribed away or otherwise removed, to expose the underlying conductive substrate and to facilitate interconnection. A conductive grid may be applied to the top sheet and configured to form electrical connections between adjacent cells that are placed in contact with the grid.

Figure 1:
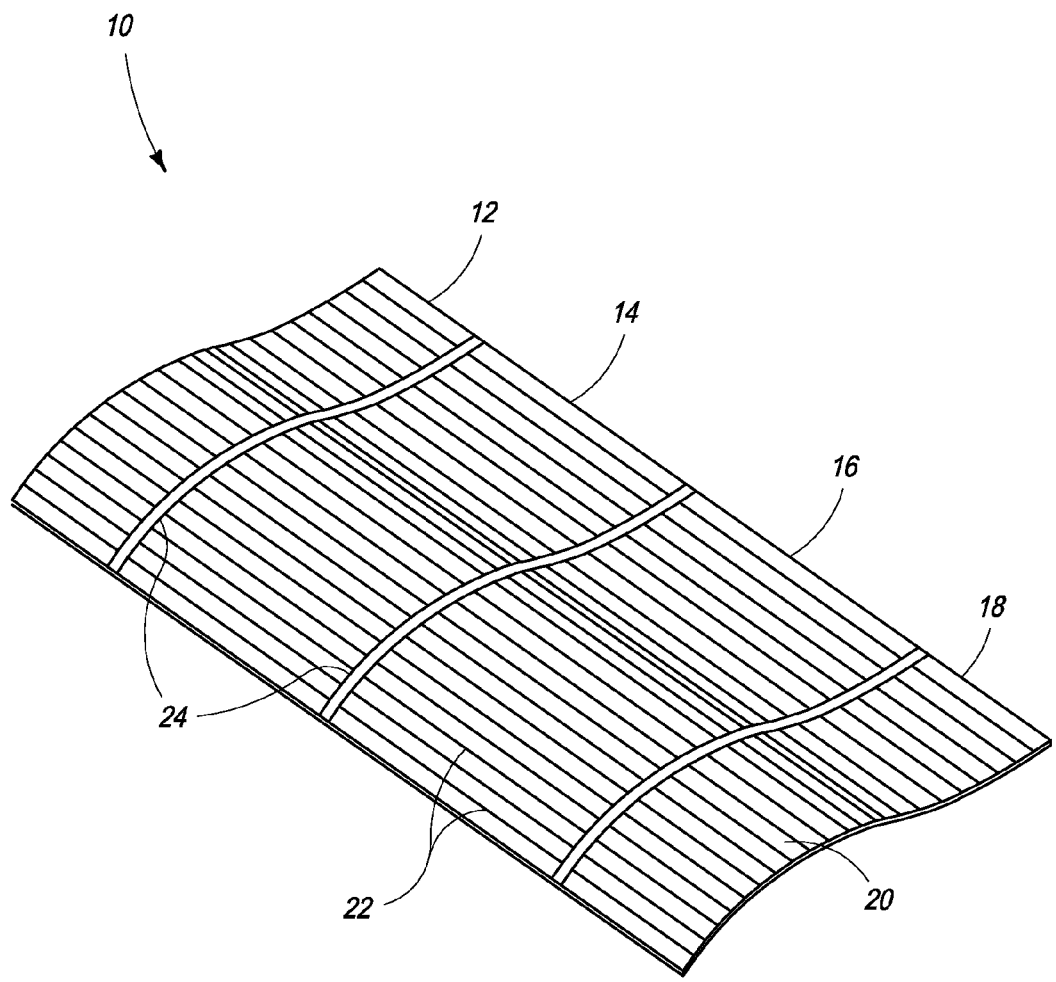
FIG. 1 is a perspective view of photovoltaic cell according to aspects of the present teachings.

FIG. 1 depicts a photovoltaic cell, generally indicated at 10, according to aspects of the present teachings. Cell 10 includes a plurality of discrete, interconnected photovoltaic portions 12, 14, 16, 18. Any number of two or more discrete cells such as cell 10 may be interconnected to form a module according to the present teachings. Each of the photovoltaic cells typically includes a conductive substrate, upon which are disposed various layers, including photoactive material such as adjacent layers of cadmium sulfide (CdS) and a layer of copper indium gallium diselenide (CIGS) to form a p-n junction. More details regarding the composition and manufacture of exemplary photovoltaic cells that may be used in conjunction with the present teachings are disclosed in U.S. Pat. No. 8,062,922, which is incorporated by reference.

Cell 10 also includes an optically transparent top surface 20 overlying the photoactive surface. A conductive grid 22 is configured to collect unbound electrons from a top surface of the cell. Buss bars 24 also may be applied to the top of the cell and interconnected with the conductive grid, to improve the collection of electrons by the grid. Cell 10 will generally be cut from a larger quantity of thin film, flexible photovoltaic material.

Figure 2:
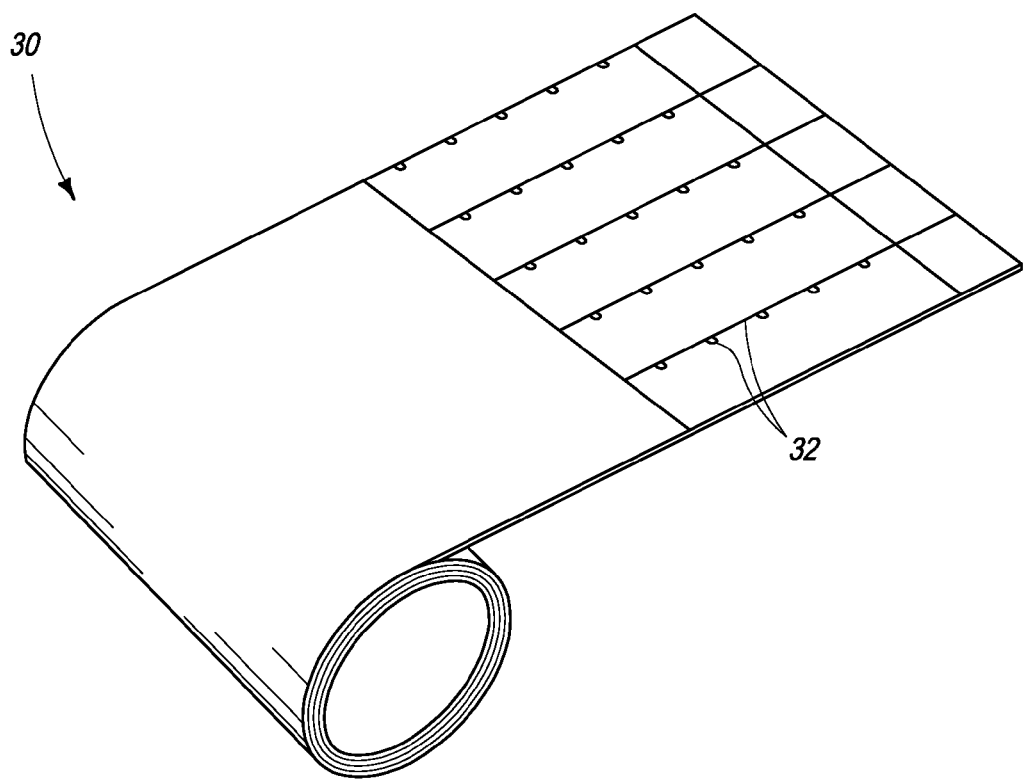
FIG. 2 is a perspective view of a roll of photovoltaic material with portions of a photoactive layer of the material scribed away, according to aspects of the present teachings.

FIG. 2 depicts an intermediate article of manufacture in the form of a roll 30 of photovoltaic material. The material of roll 30 includes a conductive substrate and various layers overlying the substrate, and can be thought of as a continuous roll of material that may be cut into discrete cells such as cell 10 depicted in FIG. 1. The material of roll 30 includes various portions 32 from which the layers overlying the conductive substrate have been obliterated, scribed away or otherwise removed, to expose the underlying substrate. For example, the overlying layers of material may be removed from portions 32 of the material through laser scribing. Portions 32 where the substrate is exposed serve various purposes that will be described below.

Figure 3:
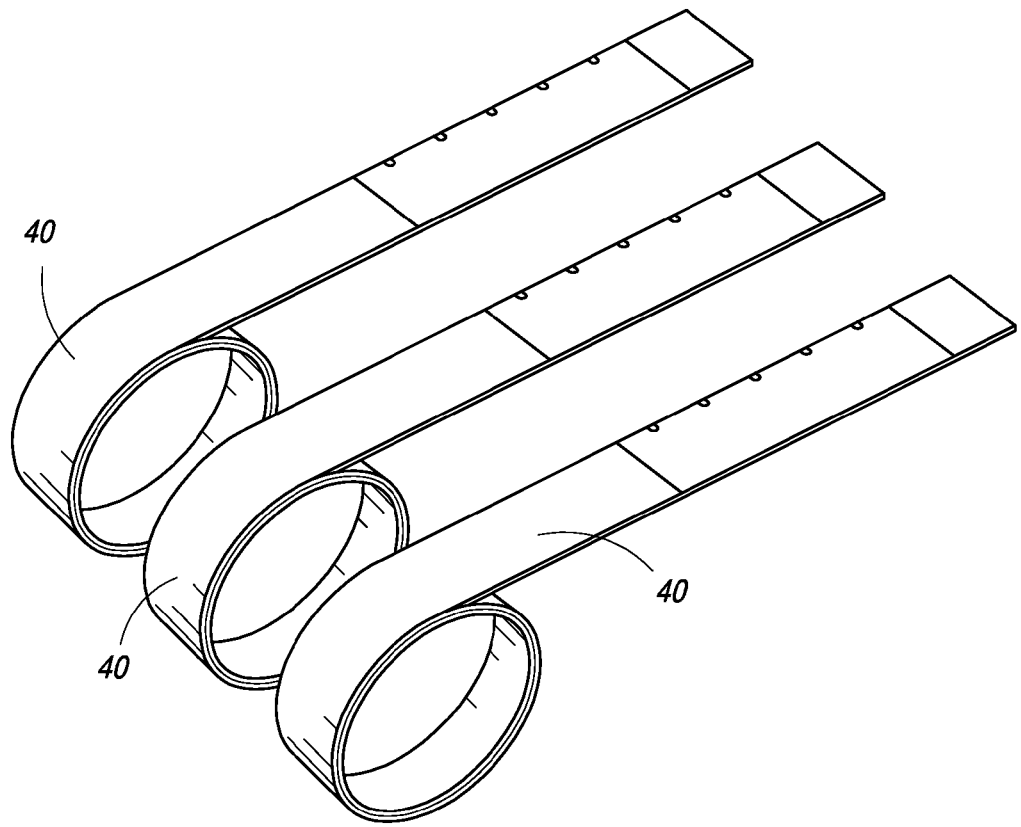
FIG. 3 is a perspective view of the photovoltaic material of FIG. 2 showing the material cut into several reels, according to aspects of the present teachings.
Figure 4:
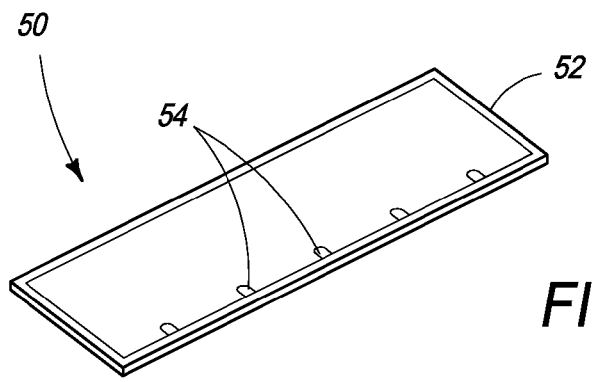
FIG. 4 is a perspective view of a discrete photovoltaic cell that has been cut from one of the reels depicted in FIG. 3, according to aspects of the present teachings.

FIG. 3 depicts another intermediate article of manufacture in the form of a plurality of reels 40 of photovoltaic material. Reels 40 have been formed by cutting or slitting roll 30, as should be apparent through comparison of FIG. 3 with FIG. 2. FIG. 4 depicts yet another intermediate article of manufacture in the form of a discrete photovoltaic cell 50, which has been formed by cutting the material of one of reels 40 across its width. Cell 50 may be used in a module of interconnected photovoltaic cells, as described in more detail below.

FIG. 4 also depicts in more detail portions 32 from which the material overlying the conductive substrate has been removed. Specifically, portions 32 include both a peripheral outline portion 52 that lies just within the outer perimeter of cell 50, and several interior outline portions 54. Peripheral outline portion 52 helps to electrically isolate cell 50 from adjacent cells and also helps to avoid unwanted shorting that may otherwise occur near the edges of the cell. Interior outline portions 54 define electrically isolated interconnection areas on the front side of each cell, which facilitate the interconnection of adjacent cells as described below.

Figure 5:
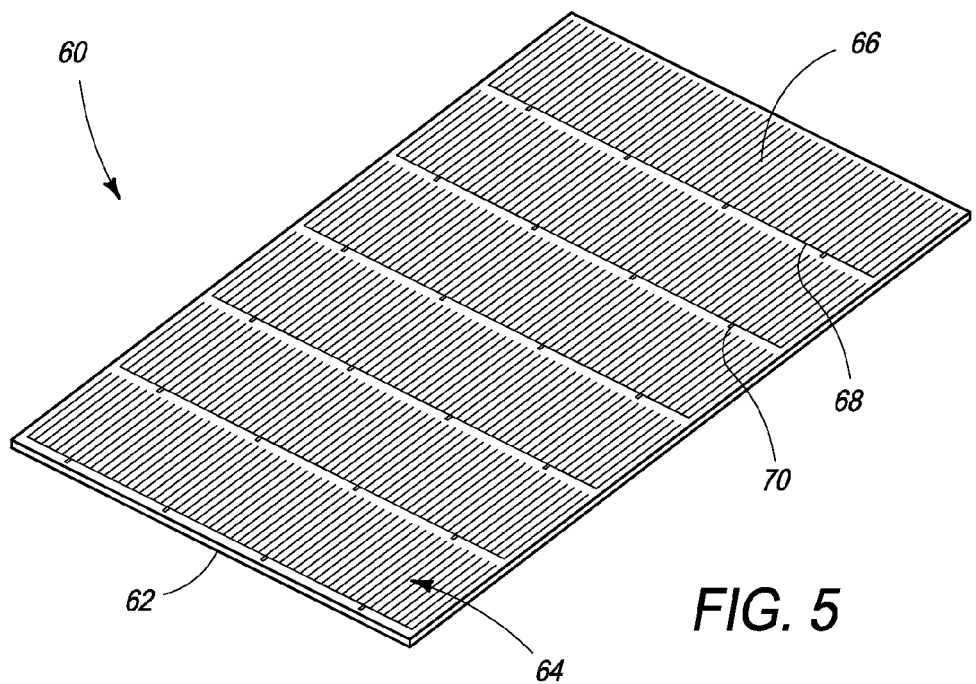
FIG. 5 is a perspective view of an optically transparent top sheet with a conductive grid applied to the sheet, according to aspects of the present teachings.

FIG. 5 depicts a substantially optically transparent top sheet 60 that includes a substrate 62 and a conductive collection grid, generally indicated at 64, applied to the substrate. For example, substrate 62 may be constructed from a clear polymer, and grid 64 may be constructed from a suitable conductive metal such as copper or silver which is printed, etched, electroplated or otherwise applied to the substrate. Grid 64 generally includes collection lines or "fingers" 66, buss bars 68, and interconnection tabs 70 extending from each buss bar.

Figure 6:
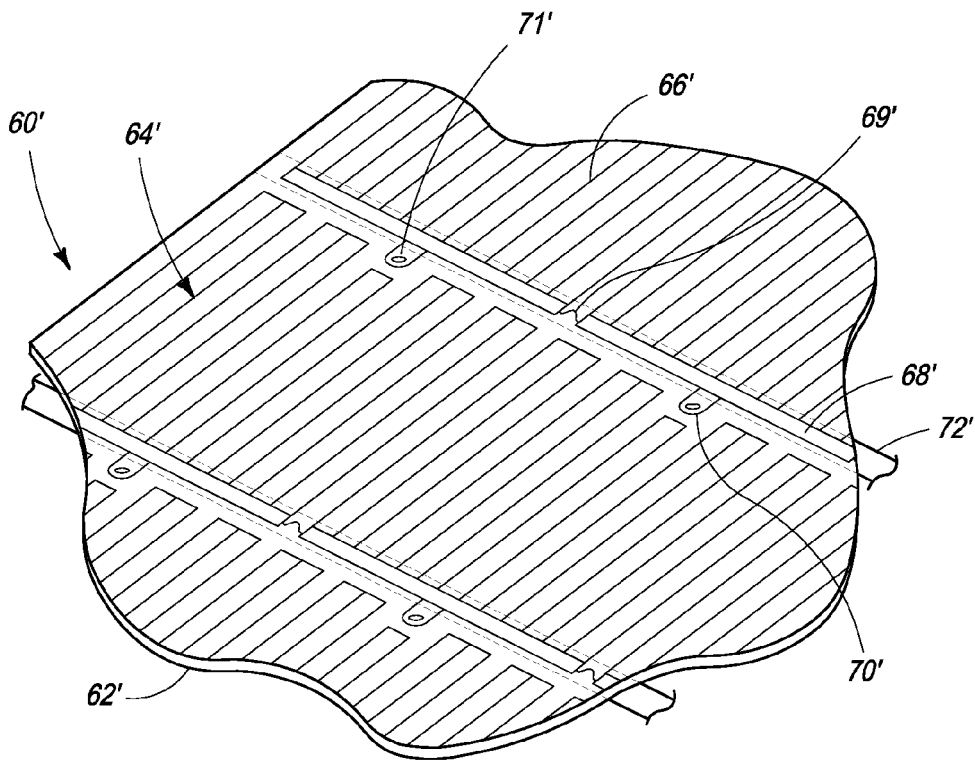
FIG. 6 is a magnified perspective view of another optically transparent top sheet with a conductive grid and strips of dielectric applied to the sheet, according to aspects of the present teachings.

FIG. 6 is a magnified view depicting a portion of an alternative substantially optically transparent top sheet 60'. Like top sheet 60 of FIG. 5, sheet 60' of FIG. 6 also includes a substrate 62' and a conductive collection grid, generally indicated at 64', applied to the substrate. Also similarly to top sheet 60, grid 64' of top sheet 60' includes collection lines or "fingers" 66', buss bars 68', and interconnection tabs 70' extending from each buss bar. However, as depicted in FIG. 6, lines 66', buss bars 68' and interconnection tabs 70' are slightly different in top sheet 60' than their counterparts in top sheet 60.

More specifically, grid lines 66' form a plurality of closed rectangular loops rather than just individual linear extensions from the buss bar, buss bar 68' includes mechanical stress relieving serpentine portions 69', and interconnection tabs 70' include interconnection fiducial lines 71' (depicted as circular in FIG. 6). FIG. 6 also shows semi-transparent dielectric strips 72' attached to the top sheet and covering buss bars 68'. These strips could be applied in a similar manner to top sheet 60. The function of fiducial lines 71' and dielectric strips 72' will be described below.

Figure 7:
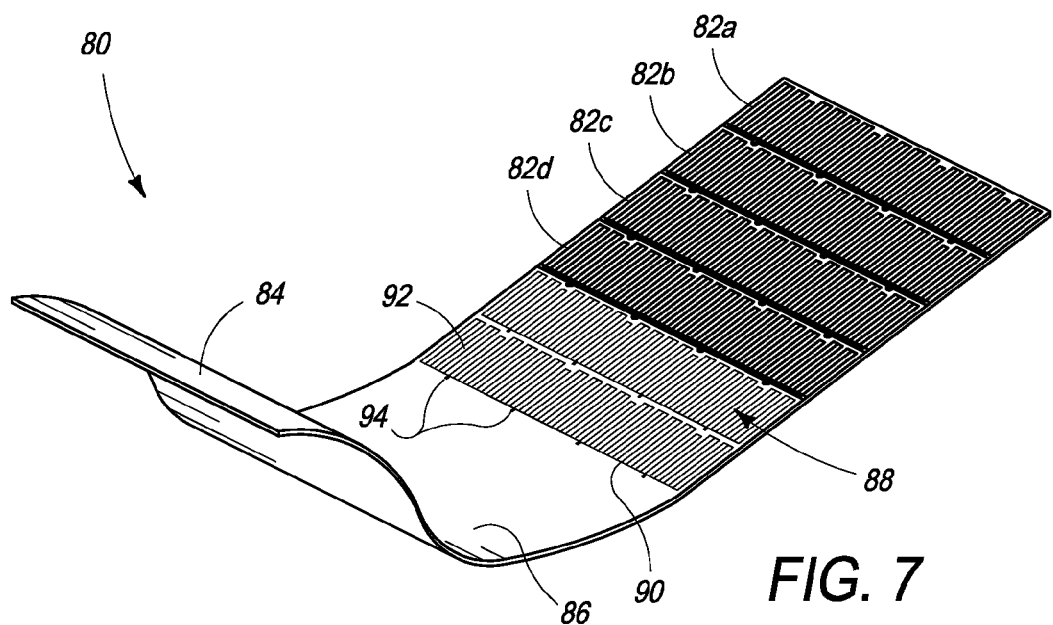
FIG. 7 is a perspective view of several discrete photovoltaic cells positioned on an optically transparent top sheet and on a conductive grid of the top sheet, according to aspects of the present teachings.
Figure 8A:
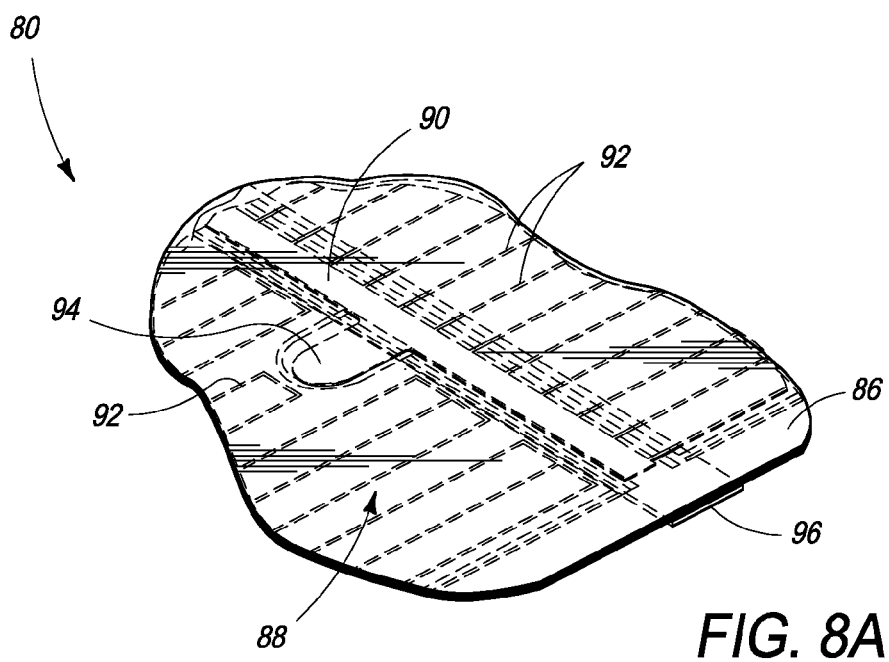
FIG. 8A is a magnified view of portions of the cells, top sheet and grid of FIG. 7, showing details of an interconnection region between the cells.
Figure 8B:
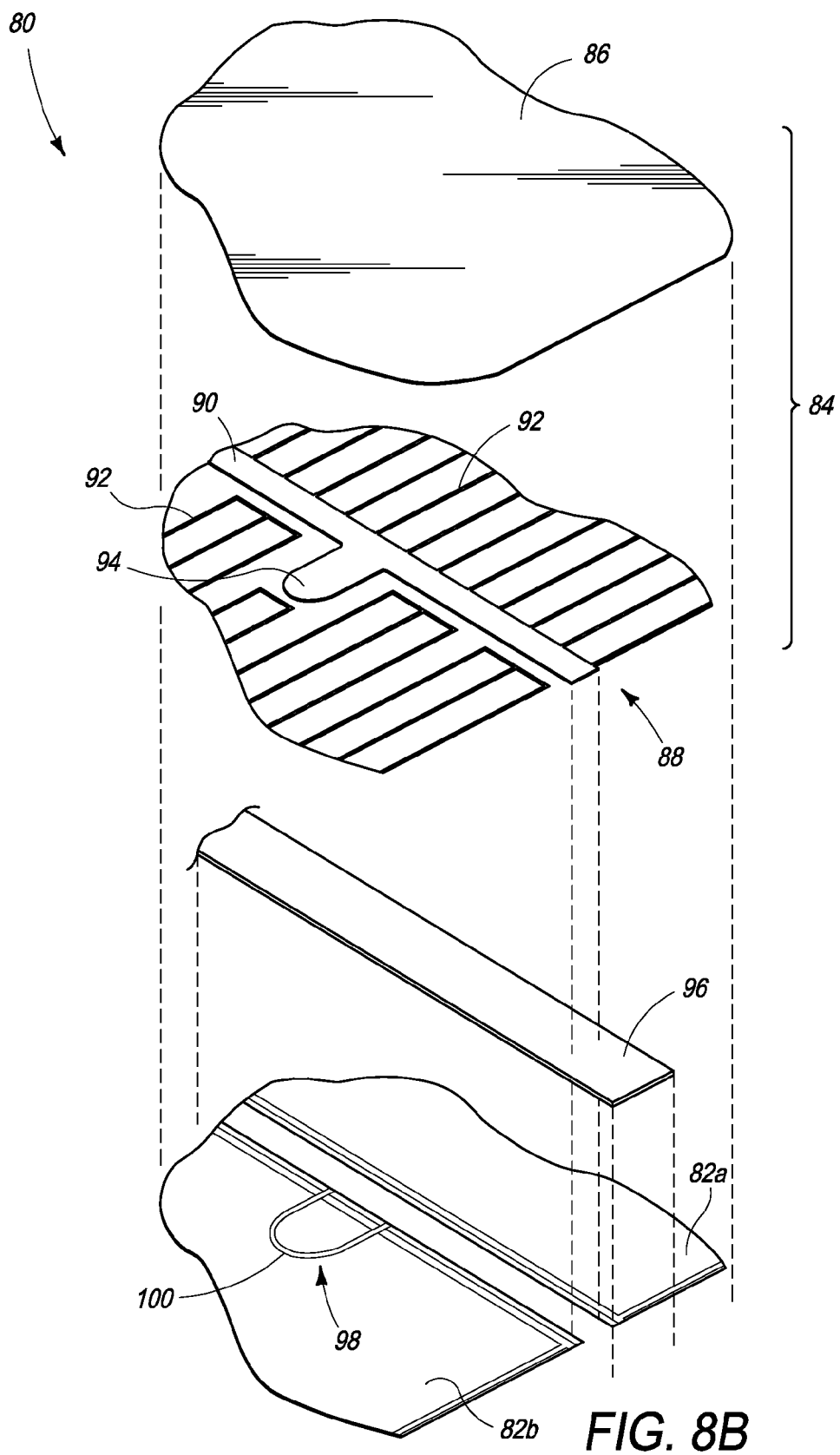
FIG. 8B is an exploded view of the assembly of FIG. 8A.

FIG. 7 and FIGS. 8A-8B depict yet another intermediate article of manufacture, generally indicated at 80, according to aspects of the present teachings. More specifically, FIG. 7 shows a perspective view of intermediate article 80, FIG. 8A shows a magnified perspective view of a portion of the intermediate article, and FIG. 8B shows an exploded view of the portion of the intermediate article shown in FIG. 8A.

Intermediate article 80 includes a plurality of photovoltaic cells 82a, 82b, 82c, 82d, each of which may be substantially similar to cell 50 described previously (see FIG. 4). Cells 82 have been positioned on a substantially optically transparent top sheet, generally indicated at 84, which is similar to top sheets 60 and 60' (see FIGS. 5-6). The views of FIG. 7 and FIGS. 8A-8B all depict article 80 from the side opposite the side where the cells contact the top sheet, i.e., the views of FIGS. 7-8 are looking through the transparent top sheet.

Top sheet 84 includes a clear polymer layer 86, upon which has been printed a conductive grid pattern, generally indicated at 88. As can be seen most clearly in FIGS. 8A-8B, grid pattern 88 includes buss bars 90 and grid lines 92 extending from each buss bar. Grid lines 92 form a plurality of closed paths, rather than simply forming individual lines extending from the buss bars. This provides some redundancy in the grid pattern, in case the conductive path along a particular grid line becomes interrupted, for instance if the grid line happens to be damaged.

A plurality of interconnection tabs 94 also extend from each buss bar, from a side opposite the side from which the grid lines extend. Buss bars 90, grid lines 92 and tabs 94 all form a continuous electrically conductive grid pattern 88. After grid pattern 88 is applied to polymer layer 86, dielectric strips 96 may be applied to cover the buss bars. This can help to prevent shunting in the regions where the cell edges are close to the buss bars.

FIGS. 8A-8B also depict how adjacent cells 82*a* and 82*b* may be electrically interconnected in series. Specifically, cell 82*b* is positioned with its interconnection regions, generally indicated at 98, each overlapping at least one of the interconnection tabs 94 of grid pattern 88. Typically, as should be apparent from FIG. 7, each cell will overlap a plurality of interconnection tabs of the grid pattern. Due to scribed perimeter 100 of the interconnection regions, regions 98 are electrically isolated from the remainder of the photoactive top surface of cell 82*b*. However, any portion of cell 82*b* in electrical contact with the interconnection tab 94 shown in FIGS. 8A-8B will also be in electrical contact with corresponding buss bar 90 and grid lines 92 of grid pattern 88, and thus with the top photoactive surface of adjacent cell 82*a*. As will be described in more detail below, this facilitates electrical series connection of the adjacent cells.

In some cases, reliable physical and electrical contact between the cells and the collection grid may be obtained as a result of an eventual lamination step, which typically also involves one or more additional encapsulant layers disposed below the cells and/or above the top sheet. In other cases, however, it may improve durability to add an adhesive layer between the cells and the grid. This adhesive layer (not shown) may be applied to the cells, the grid, or both. The use of an adhesive that is thermally curable has the advantage that it may be cured automatically during the module lamination process. Generally, a suitable adhesive will be substantially optically transparent, to maximize the amount of solar radiation reaching the photovoltaic cells. The adhesive also may be electrically conductive.

Figure 9:
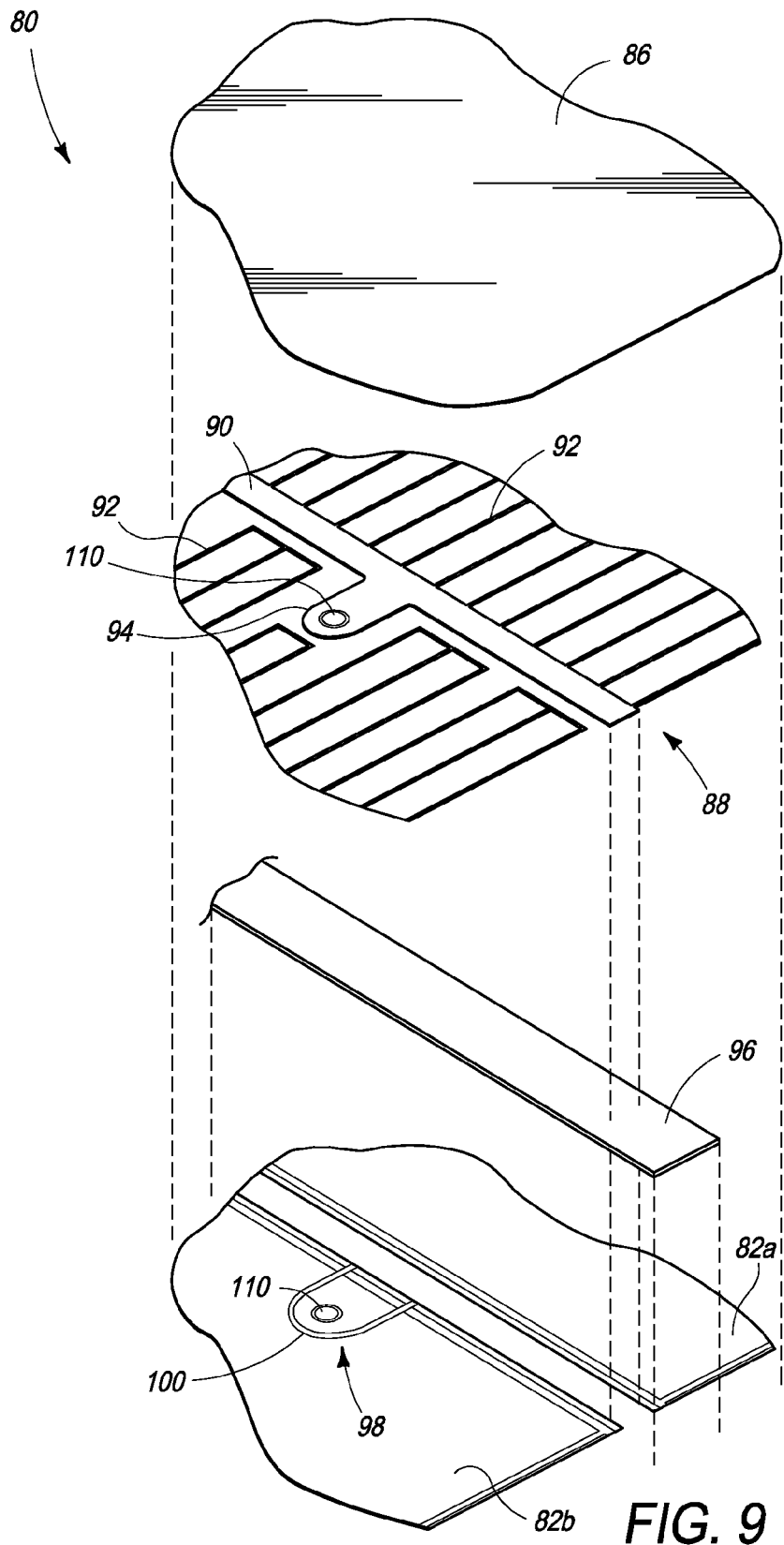
FIG. 9 is a magnified exploded view similar to the view of FIG. 8B, depicting a variation of the conductive grid according to aspects of the present teachings.

FIG. 9 is a magnified perspective view similar to FIG. 8B, except that in FIG. 9, a central portion of interconnection region 98 of cell 82*b* has been electrically connected to interconnection tab 94 of grid pattern 88, as indicated by circular regions 110 of the cell interconnection region and the grid interconnection tab. For example, the central portions of interconnection regions 98 of cell 82*b* may be laser welded to central portions of corresponding interconnection tabs 94. Laser welding generally causes the interconnection tabs to make electrical contact with the conductive substrate of cell 82*b*, for example by melting, vaporizing, obliterating or otherwise penetrating the photoactive layers above the substrate of cell 82*b*. Alternatively, laser welding may convert the photoactive layers into material having low ohmic resistance (for example, resistance of 0.1 milliohms-cm$^2$ or less), thus allowing an electrical connection between the conductive grid pattern and the underlying conductive substrate of cell 82*b*.

Furthermore, the laser welding operation may cause the metal of the interconnection tabs and/or the substrate to melt together to some extent, so that the tabs and the substrate become joined together as the molten metal comingles and cools. In any case, as a result of laser welding, grid pattern 88, which is in electrical contact with the photoactive composition of cell 82*b*, is placed into electrical contact with portions of the substrate of cell 82*b* located within the interconnection areas of cell 82*b*. This provides electrical interconnection of the top or "sunny" side of cell 82*a* with the opposite polarity side of cell 82*b*, i.e. cells 82*a* and 82*b* are electrically interconnected in series. Similarly, each pair of adjacent cells 82 in FIG. 7 may be electrically interconnected in series.

According to the present teachings, various types of lasers may be used to laser weld photovoltaic cells to interconnection tabs of a connection grid, and the most appropriate laser may depend on the precise composition and thickness of the photoactive cell layers, the cell substrate, and/or the conductive grid. For example, to laser weld a 30 μm thick stainless steel cell substrate to a 37 μm thick copper interconnection grid tab, one type of laser that may be suitable is a continuous-wave fiber laser emitting at a wavelength of approximately 1070 nm and with a power of approximately 30-70 Watts, focused to a beam diameter of approximately 30-80 μm, scanned at a rate of approximately 400-800 mm/sec and in a circle of approximately 1-4 mm in diameter to produce a similar size weld. The laser will typically be directed to impinge first on the back side of the cell substrate, although in some cases the laser may be directed from the opposite side of the photovoltaic assembly, i.e. to impinge first on the transparent top sheet rather than the substrate.

Figure 10:
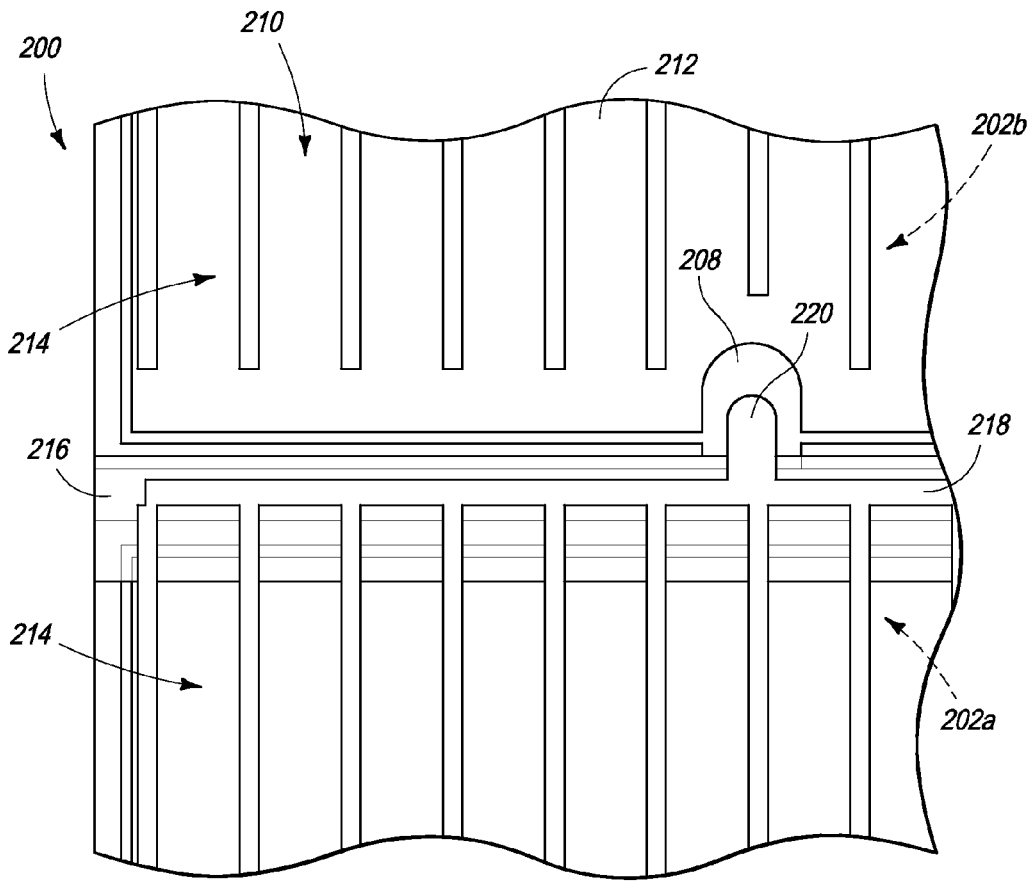
FIG. 10 is top plan view of portions of two adjacent, photovoltaic cells positioned on a top sheet and a conductive grid, according to aspects of the present teachings.

The general process of electrically connecting the top or "sunny" side of one cell to the top of the conductive substrate (and thus the opposite polarity) of an adjacent cell may be accomplished in various alternative ways. For example, FIG. 10 depicts portions of a photovoltaic module, generally indicated at 200, in which a pair of adjacent photovoltaic cells 202*a*, 202*b* have been electrically interconnected in series. The interconnection of cells 202*a* and 202*b* is generally similar to the interconnection of cells 82*a* and 82*b* described above, except that the interconnection regions of the cells in module 200 are removed before the cells are interconnected, rather than as part of the interconnection process, as described below.

Specifically, each of cells 202*a* and 202*b* includes a conductive substrate which is overlaid with a photoactive composition, such as adjacent layers of n-type and p-type semiconductor material. As described previously, other layers of material, such as a back contact layer and/or a back side protective layer, also may be deposited on one or both sides of the substrate. According to the present teachings, a back side protective layer need not be electrically conductive, because electrical contact to the back side polarity is made through the front of the cell substrate. For example, a low cost, stable coating, such as an oxide or a nitride, may be used to protect the back side of the cell substrate. Photoactive material has been scribed away from portions of each cell, electrically isolating edge portions of the cells, including an interconnection area 208 of cell 202*a*, and exposing the conductive substrate. More generally, several such interconnection areas would exist on each cell.

Cells 202*a* and 202*b* are disposed on an interconnection component, generally indicated at 210, which includes an optically transmissive top sheet 212 with a conductive grid pattern, generally indicated at 214, disposed on the side of the top sheet facing the cells, and a dielectric strip 216 covering a portion of the grid pattern including a buss bar 218, to prevent possible shorting (or "shunting") when cells 202a and 202b are positioned near each other on the interconnection component.

In FIG. 10, the perspective is from above top sheet 212, with the grid pattern and the cells both disposed on the far side of the top sheet. Grid pattern 214 electrically interconnects the adjacent cells by providing electrical contact between an interconnection tab 220 of the grid pattern and the conductive substrate of cell 202b in each interconnection area 208, and also directly contacting the photoactive composition of cell 202a. The conductive substrate of cell 202b in the interconnection area is electrically isolated from the top or "sunny" side of cell 202b, and therefore shares the polarity of the bottom side of the photoactive composition of cell 202b. Grid pattern 214 electrically connects this polarity of cell 202b with the top or "sunny" side polarity of cell 202a, forming an electrical series connection between the two adjacent cells.

Although cells 202a and 202b are nominally interconnected as soon as they are placed in the positions shown in FIG. 10, an additional interconnection step will still typically be used to form a more reliable electrical connection. For example, laser welding may be used to bond a central portion of each interconnection area 208 to the corresponding interconnection tab 220. As described previously, in some cases the photovoltaic assembly may be laser welded from the conductive substrate side, whereas in other cases the photovoltaic assembly may be laser welded from the top sheet side. In either case, laser welding generally serves to form a strong bond between the metals of the substrate and the interconnection tabs, by melting comingling the metals, which then solidify to form a reliable physical and electrical connection.

More generally, cells may be interconnected according to the present teachings by creating electrically isolated interconnection areas on each cell, where each electrically isolated interconnection area is characterized by an absence of photoactive composition within at least a portion of the interconnection area. As depicted in FIGS. 7-9 and described above, the electrically isolated interconnection areas each may be characterized by an absence of photovoltaic composition around a perimeter of the interconnection area, prior to interconnecting the adjacent cells. The photovoltaic composition may be removed from the perimeter area, for example, by laser scribing, in some cases during the same scribing operation that removes the photoactive material from edge portions of each cell.

After the interconnection areas have been electrically isolated, cell interconnection may be accomplished by laser welding or otherwise modifying, penetrating, melting and/or obliterating some of the photoactive composition in a central portion of the electrically isolated interconnection areas, to form an electrical connection between the substrate of the corresponding cell and an overlying connection grid, which in turn makes electrical contact with the top or "sunny" side of the adjacent cell. In this case, the interconnection operation itself (e.g., laser welding) causes some additional removal of photovoltaic material from the interconnection areas.

Alternatively, as depicted in FIG. 10 and also described above, the photoactive composition may be removed from the interconnection areas prior to placement of the cells against the connection grid, for example by laser scribing the photoactive material off of the interconnection areas during the same scribing operation that removes the photoactive material from edge portions of each cell to help prevent shunting between cells. In this case, the electrically isolated interconnection areas each may be characterized by an absence of photoactive composition within substantially the entire interconnection area. An additional interconnection operation such as laser welding still may be used to form a reliable physical and electrical connection between the substrate and the interconnection tabs of the connection grid in the interconnection areas.

Figure 11:
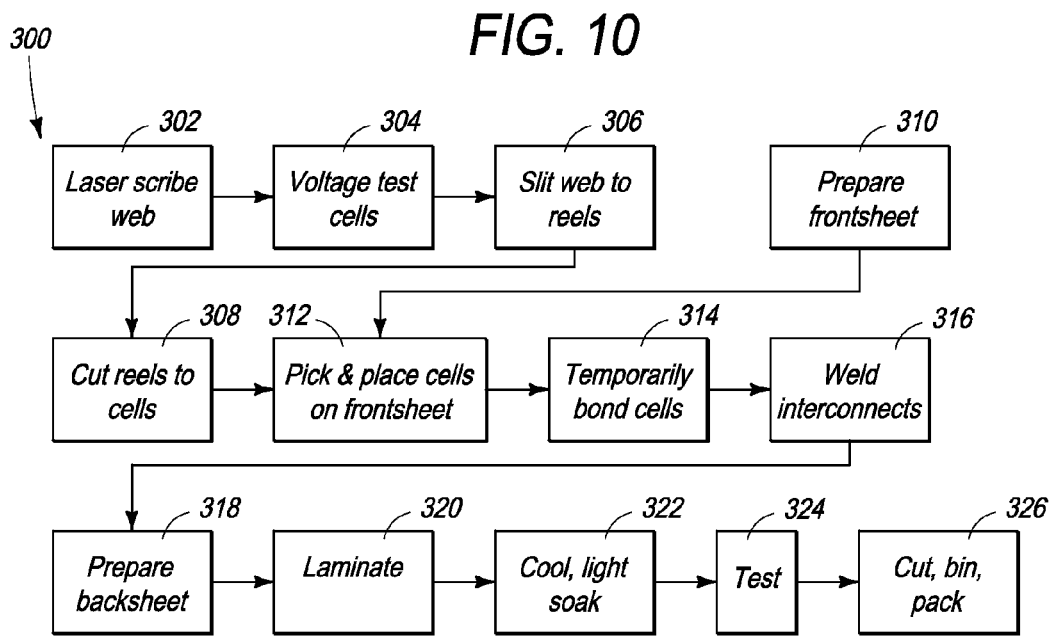
FIG. 11 is a flow diagram depicting a method of manufacturing a photovoltaic module, according to aspects of the present teachings.

FIG. 11 is a flow chart depicting a method, generally indicated at 300, of manufacturing a photovoltaic module according to aspects of the present teachings. In method 300, it is assumed that suitable photovoltaic material, including a photoactive composition deposited on a conductive substrate, has already been manufactured and is available to incorporate into a module. In some cases, however, method 300 could include preliminary steps of manufacturing the photovoltaic material, as described, for example, in the references that have been incorporated into this disclosure. The photovoltaic material used in method 300 will generally be referred to as a photovoltaic "web."

At step 302, the web of photovoltaic material is laser scribed to remove the photoactive composition and expose the conductive substrate in certain regions. Specifically, as depicted, for example, in FIG. 2, the web may be scribed to define perimeter portions of individual cells and also to define perimeter portions of interconnect regions. In some cases, as described previously (see FIG. 10), the photoactive composition may be completely scribed away from the interconnect regions. The scribing performed in step 302 serves to electrically isolate the interconnection regions, provides reference lines for subsequent cutting operations, and isolates individual cells for voltage testing.

At step 304, the cell regions defined by the scribe lines are voltage tested. This is typically done in a roll-to-roll process, by irradiating the cells and simultaneously testing the voltage induced between the top and bottom of each cell or selected cells. This is a form of quality control that allows cells to be categorized by efficiency, or in extreme cases discarded.

At step 306, the web of photovoltaic material is slit into a plurality of reels, as depicted, for example, in FIG. 3. This allows the web to be cut into desired widths for different products or applications, as the cell width is determined by the reel width. At step 308, the reels of photovoltaic material are cut into individual cells, as depicted, for example, in FIG. 4. This allows the reels to be cut into cells of any desired size, based on the fiducial lines that were scribed in step 302. Step 308 may be performed in a "step and repeat" motion so that the cells are cut at instants when the photovoltaic material is motionless or nearly so.

At step 310, a frontsheet (which also may be referred to as a top sheet) is prepared. Preparing the frontsheet will generally include applying a conductive grid pattern to one side of a substantially optically transparent planar material, such as a clear polymer material. The frontsheet may be constructed from a thermoplastic layer. For instance, in one specific example, a suitable thermoplastic layer may include an ionomer obtained from DuPont under the trade name Surlyn. The frontsheet is a clear sheet of starting substrate, for example (PET), which in this specific example has a thickness of approximately 50-microns. The PET receives an even extrusion coating of the ionomer everywhere on one side, for example, about 100-microns in thickness. The grid pattern is then applied to the frontsheet as described below.

The grid pattern will generally include buss bars, grid lines, and interconnection pads configured to electrically interconnect adjacent photovoltaic cells placed in contact with the grid pattern, as described above. For example, any of the grid patterns depicted in FIGS. 5-10 may be suitable. The grid pattern may be constructed from a conductive metal such as copper, and may be applied by any suitable method, such as printing. Alternatively, the grid pattern on the front sheet may be defined using an "etch resist" pattern, and then the copper in all other areas may be removed (chemically etched away). After the etch step, copper remains only in areas where it is desired to form the conductive grid and/or conducting traces for a reverse diode structure, to be described in more detail below. The frontsheet material remains exposed everywhere where the copper has been removed, i.e., around the grid structure.

Preparing the frontsheet at step 310 also may include applying strips of dielectric material over the buss bars of the grid pattern to help prevent shunting where cell edges touch or come near the buss bars. The dielectric strips will typically be substantially transparent, and may be applied, for example, in a rotary printing process or any other suitable process. Also as part of preparing the frontsheet, the dielectric may be cured, for instance in a fast ultraviolet curing process.

At step 312, the cells cut in step 306 are placed into suitable positions on the frontsheet prepared in step 308. This step may be performed as a "pick and place" operation, where the frontsheet moves forward by the length of one cell, stops as the cell is placed into position on the frontsheet, and then the movement is repeated. The cells will generally be placed into positions so that they may be electrically interconnected in series by the connection grid of the frontsheet, as described previously. Specifically, each cell will be placed with most of its surface contacting the grid lines of the frontsheet, and also with one or more electrically isolated interconnection areas of the cell overlapping interconnection pads of the frontsheet grid.

After or during placement step 312, each cell may be temporarily bonded in place, for example with a small amount of adhesive or by heat staking, as indicated at step 314. Heat staking may be accomplished by, for example, using direct heat from laser diodes, a laser, or hot air jets, which are directed at a small number of spots, for example, 1- to 2-cm in diameter, to melt an adjacent layer of the frontsheet and bond it to the cells. The partially assembled "prelaminate" structure also may passed through a pair of "nip" rollers to press the front sheet and the photovoltaic layers together, causing them to stick together in a few small spots, which is enough to hold the assembly together as it is rolled up.

In some cases, alternatively or in addition to heat staking, a thin layer of adhesive may be applied to the cells and/or the frontsheet before the cells are placed on the frontsheet. This adhesive will typically be curable in a subsequent lamination step, but may adhere sufficiently prior to lamination to hold the cells in place on the frontsheet during the manufacturing process. In a subsequent step later in the process, the entire assembly goes through final lamination where it is re-melted, causing it to stick together everywhere.

At step 316, the portions of conductive substrate underlying the interconnection areas of each cell are physically and electrically connected to the interconnection pads of the frontsheet grid, typically by laser welding. As described above, laser welding a small central portion of each interconnection area has been found to cause modification, penetration or obliteration of the cell layers overlaying the cell substrate, so that the cell substrate is placed into electrical contact with the associated interconnection pad. Furthermore, laser welding causes robust physical attachment of the interconnection pads to the cell substrate. Laser welding may be performed either from the cell substrate side or from the frontsheet side of the assembly. The specifications of a suitable laser and laser welding operation have been described previously.

At step 318, a backsheet is prepared. The backsheet will be disposed beneath the conductive substrate of the cells, and can serve purposes such as insulating and/or protecting the back side of the photovoltaic assembly. For example, the backsheet may include materials to resist corrosion, such as chromium, molybdenum, or suitable alloys thereof. The backsheet also may include one or more polymer layers, which may be constructed from materials such as PET, PEN, PEEK, polyimide, or ETFE, among others. In a preferred embodiment, back sheet includes a layer of thermoplastic material, such as an ionomer. In a specific example, the backsheet may include a layer of PET with a thickness of about 50-microns, with an extruded coating of ionomer applied across the surface at a thickness of about 100-microns. As part of step 318, holes may be punched or otherwise formed in the backsheet to allow for testing and/or to provide access to the conductive back side of the assembly for electrical connections.

At step 320, the assembly is laminated to form a substantially complete module. Lamination may be performed in a single roll-to-roll operation after both the frontsheet and the backsheet are positioned on opposite sides of the photovoltaic cells, or alternatively, lamination may be performed in two or more separate operations. For example, the frontsheet may be laminated to the cells before the backsheet is positioned, and then the backsheet may be laminated to the cells. Furthermore, even after both the frontsheet and the backsheet are laminated to the cells, additional lamination may be performed. For example, additional components such as contact leads, a weatherproof front vapor barrier or cover glass, and a weatherproof back vapor barrier may be provided, and then a final lamination operation may be performed to complete the assembly.

At step 322, the module is cooled and light soaked, and then at step 324, the module is tested to measure cell performance. Finally, at step 326, the module may be cut or trimmed to remove any excess laminate from the edges, then binned according to performance and capacity, and packed for shipping.

The steps above can be performed in various orders, and in some cases steps may be omitted or replaced. For example, testing may be performed after lamination of a backsheet to the back side of the cells, but before final lamination of weatherproof layers. Similarly, the "prelaminate" formed by the lamination of a backsheet onto the cells may be cut to final module size before final lamination of weatherproof layers. Other variations are also possible. Accordingly, many methods are encompassed by the present teachings, and specifically by the method steps outlined above.

The next portion of the present disclosure describes the use of thin film bypass diodes in conjunction with the previously described photovoltaic assemblies and method of manufacture; see FIGS. 12-17.

To produce useful voltages, individual photovoltaic cells are serially connected in photovoltaic modules. Since the current must be the same at all points in a series circuit, each cell is forced to produce or conduct the same current as the entire string. A potential problem arises whenever one or several cells are 'shaded', reducing their produced current. For example, a cell might be literally shaded while others in the string remain exposed to sunlight, or a cell might stop performing at full capacity for some other reason. A string of any reasonable number of cells has a high enough voltage to exceed the reverse breakdown voltage of a single, shaded cell.

In this case, the other cells force the string current through the shaded cells in a 'reverse' sense to the diode formed by the PV cell.

This usually causes irreversible damage to the shaded cell (a permanent shunt at the site of the reverse breakdown), and subsequently a permanent loss in power output even when the shade is removed. Moreover, a 'hot spot' can appear at the site of reverse breakdown in the shaded cell, causing damage to the PV package, or even a safety hazard due to the danger of fire.

The potential for cell damage due to current forced through the cell is a feature of all photovoltaic systems, including crystalline silicon and thin film types. Typically, photovoltaic modules incorporate bypass diodes to protect each cell, groups of cells, or the module from reverse currents and thus breakdown events with the attendant damage. Commercially produced silicon semiconductor or Schottky diodes, usually in a standard electronics package with tab or axial leads, are typically added to a photovoltaic module. In the most extensive cases, one or more diodes are added across each photovoltaic cell (in a reverse polarity).

Drawbacks of the standard approach are significantly increased cost, added manufacturing complexity, multiple fragile connections, and added failure points. Another disadvantage is that these discrete bypass diode devices create hot spots in and of themselves, by virtue of the significant heat dissipation in a small volume during the bypass operation. Excessive temperatures may cause the bypass diode to fail, or damage the photovoltaic module package.

For thin film flexible photovoltaic products, which are intended to be lightweight, several more serious drawbacks accrue because the discrete bypass diodes are of substantial thickness (often 2-5 mm). As a result, encapsulating these parts inside the protective package of the photovoltaic module necessarily increases the package thickness substantially (and thus the cost and weight, with reduced flexibility). The complexity and speed of lamination processes are adversely affected by the inclusion of the discrete diodes in the laminated package, making periodic "lumps" that must be processed without causing damage.

U.S. Pat. No. 6,690,041 entitled "Monolithically Integrated Diodes in Thin Film Photovoltaic Devices," which is hereby incorporated by reference, describes a method of using a small area of the thin film photovoltaic material, adjacent to each cell, and interconnected using scribing and monolithic fabrication schemes, to form an integral bypass diode. This method avoids the expense of adding a discrete bypass diode, and retains the thin, continuous nature of the product, permitting a very lightweight, low cost, thin lamination package for the entire module.

However, the approach of U.S. Pat. No. 6,690,041 is disadvantageous in that it consumes frontside area, i.e., area that would otherwise be used to generate power. The area required for the bypass diode is governed by heat dissipation, and can be substantial. The former approach also requires that the bypass diode be of the same material as the photoactive material, and poses a somewhat cumbersome arrangement wherein the bypass diode for one cell is located on an adjacent cell. The concept described in the disclosure retains all the advantages of the concept of U.S. Pat. No. 6,690,041, but avoids the drawbacks mentioned above.

Figure 12:
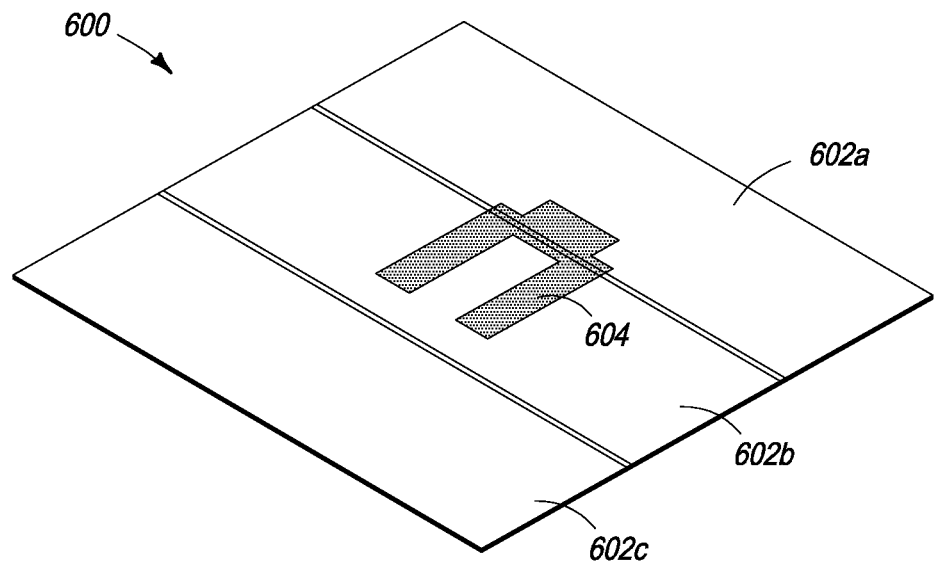
FIG. 12 is a schematic isometric view showing a dielectric material applied to the back side of two adjacent photovoltaic cells, according to aspects of the present teachings.
Figure 13:
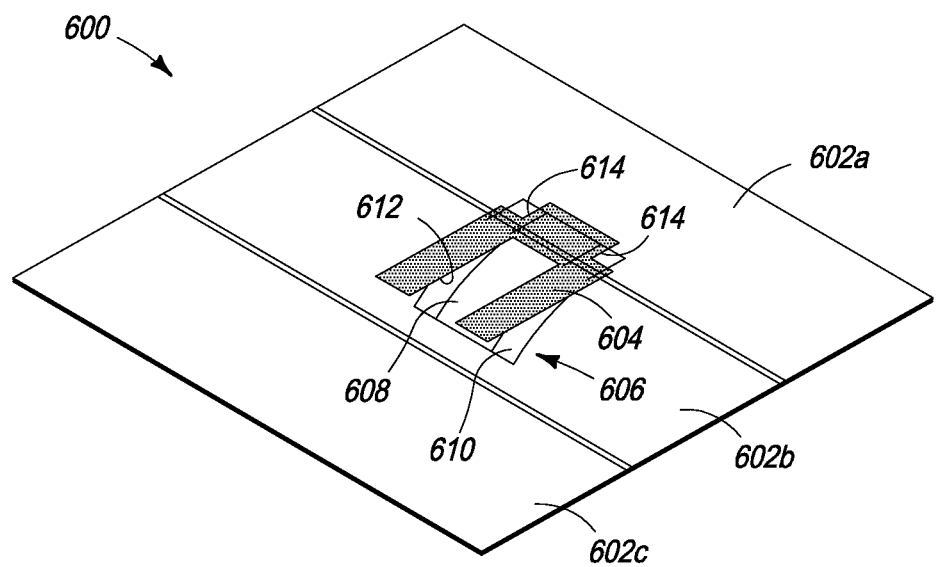
FIG. 13 is a schematic isometric view showing a bypass diode assembly being applied to the adjacent cells of FIG. 12.

FIGS. 12-13 are isometric views schematically depicting intermediate stages in the manufacture of a photovoltaic assembly, generally indicated at 600, incorporating a bypass diode according to aspects of the present teachings. Assembly 600 includes a plurality of photovoltaic cells 602a, 602b, 602c, each of which is a thin film photovoltaic cell as described previously, such as a CIGS-based cell disposed on a stainless steel substrate. The cells of assembly 600 may be fixed in their relative positions through their attachment to a frontsheet (not shown in FIGS. 12-13), as described previously.

A dielectric material pattern 604 is printed or otherwise applied to the back side of cells 602 (i.e., in contact with the conductive substrate of the cells), spanning a pair of adjacent cells such as cells 602a, 602b. Although dielectric pattern 604 is shown attached only to cells 602a and 602b in FIGS. 12-13, the dielectric pattern would generally be repeated across each pair of adjacent cells.

As can be seen in FIG. 13, a thin film diode, generally indicated at 606, is then applied to the back side of dielectric pattern 604, spanning the same adjacent cells as the dielectric pattern. Thin film diode 606, the construction of which will be described in more detail below, includes an anode portion 608, partially overlaid by a cathode portion 610. Dielectric pattern 604 and thin film diode 606 are shaped so that the anode portion of the diode contacts the back side of one of the adjacent cells (cell 602b in FIG. 13), and the cathode portion of the diode contacts the back side of the other adjacent cell (cell 602a in FIG. 13).

More specifically, dielectric pattern 604 includes one or more cutouts 612 that expose anode portion 608 of the thin film diode to the conductive substrate of one cell, and one or more cutouts 614 that expose cathode portion 610 of the thin film diode to the conductive substrate of the adjacent cell. Because the front side of one cell is connected in electrical series with the back side of the adjacent cell (see FIGS. 6-10 and accompanying description), the diode is effectively electrically connected to the front and back side of the same cell. The result is that diode 606 functions as a relatively light weight bypass diode, without reducing the exposed "sunny side" area of the photovoltaic assembly and without creating unwieldy lumps that might be difficult to laminate.

Figure 14:
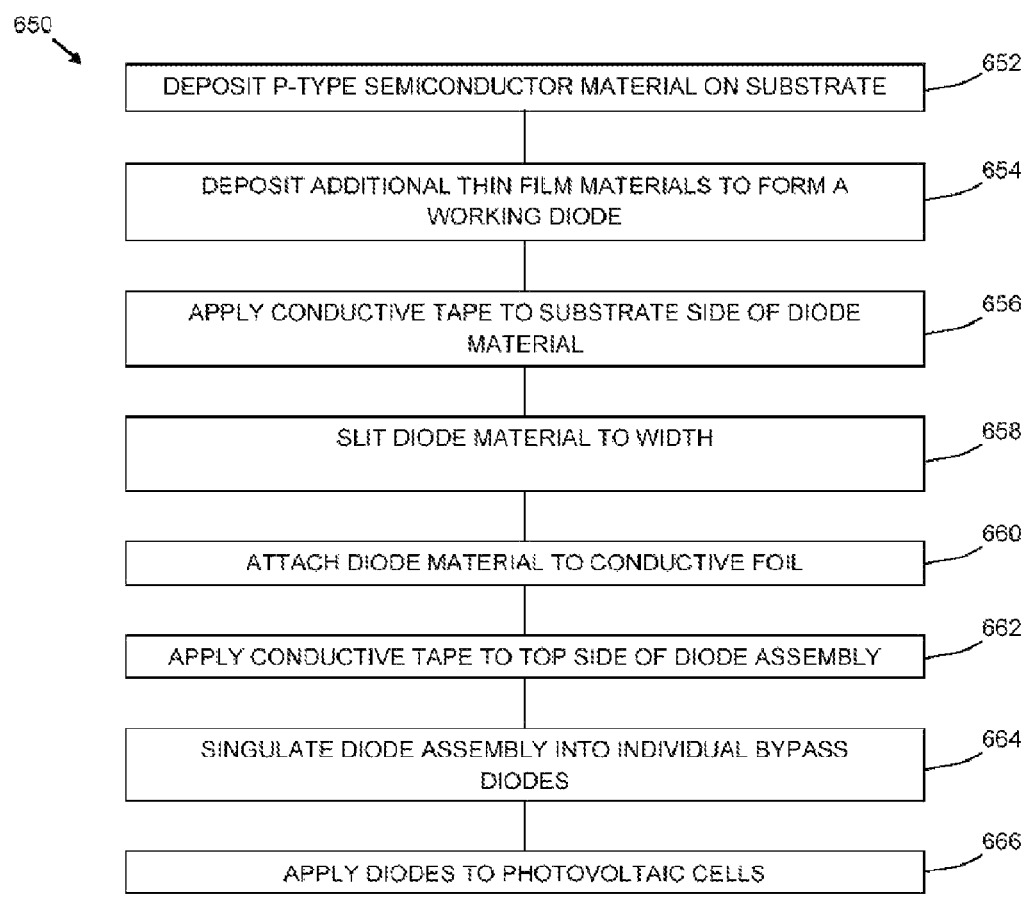
FIG. 14 is a flow chart depicting a method of manufacturing bypass diodes and applying them to photovoltaic cells, according to aspects of the present teachings.

FIG. 14 is a flow chart depicting a method, generally indicated at 650, of manufacturing a thin film bypass diode assembly and applying it to a photovoltaic cell, according to aspects of the present teachings. At step 652, a thin film of p-type semiconductor material is deposited on a conductive substrate. For example, the p-type semiconductor material of the thin film diode may be copper indium gallium selenide, or CIGS, deposited on a stainless steel or molybdenum substrate. Alternatively, the photoactive material of the thin film diode may be copper indium selenide, or CIS, also deposited on a stainless steel or molybdenum substrate. Using CIS reduces the semiconductor band gap and may improve the performance of the bypass diode.

This may be followed at step 654 by depositing additional layers of thin film materials to form a working diode. For example, step 654 may include depositing cadmium selenide (CdS) and then a transparent conductive oxide (TCO), as in the manufacture of the primary photovoltaic cell material. Alternatively, the p-type semiconductor layer may be followed by aluminum, zinc or other metal metallization for an n-type Schottky contact to reduce the forward voltage drop and also to avoid the cost and complexity of the additional CdS and TCO layers.

Steps 652 and 654 are typically performed in a reel-to-reel process, to produce a roll or "web" of thin film diode material that in many respects resembles a web of thin film photovoltaic material for photovoltaic cells. As described below, however, the thin film diode material will subsequently be processed in a manner specific to its use for bypass diodes.

At step 656, two-sided conductive tape is applied to the back side (substrate side) of the thin film diode material, and at step 658, the diode material is slit to width, for instance into relatively narrow reels of diode material. At step 660, the diode material is attached to a conductive foil, typically constructed of copper, which has a greater width than the diode material. The conductive tape adheres the diode material to the copper foil, resulting in a strip of diode material on a copper foil that extends beyond the edges of the diode material on each lateral side.

At step 662, another layer of two-sided conductive tape is applied to the top side of the diode assembly, covering both the diode material and the copper foil. At step 664, the diode assembly is singulated into individual bypass diodes, each of which may be applied to an individual photovoltaic cell at step 666, as described previously and shown in FIG. 12. The conductive tape applied in both steps 656 and 662 can be "z-axis" conductive tape, meaning that it is only substantially electrically conductive in a direction perpendicular to the plane of the tape. This may help to avoid electrical shorts that might otherwise be caused by the tape.

FIGS. 15A-D show a thin film bypass diode assembly, generally indicated at 700, at various intermediate stages of manufacture. Bypass diode assembly 700 may result, for example, from method of manufacture 650 described above, and the intermediate stages of manufacture shown in FIGS. 15A-D correspond to the steps of method 650 as described below.

Figure 15A:
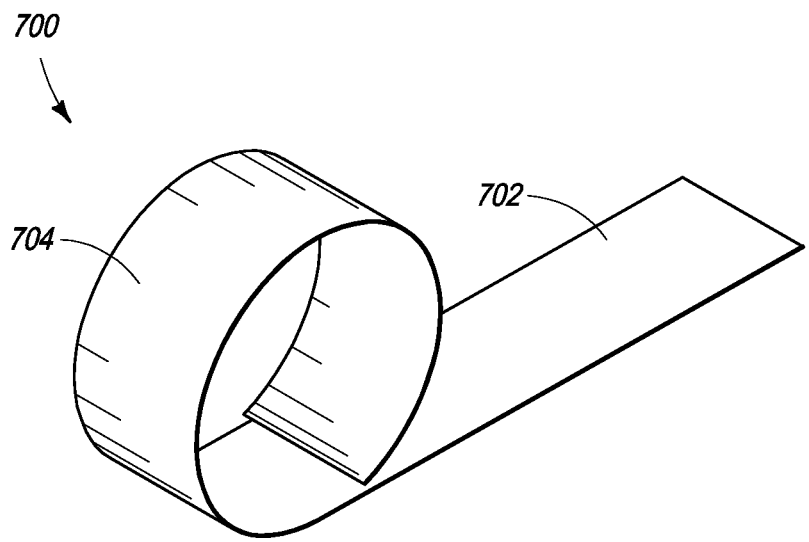
FIG. 15A is an isometric view depicting a first intermediate article of manufacture in the assembly of a bypass diode, according to aspects of the present teachings.
Figure 15B:
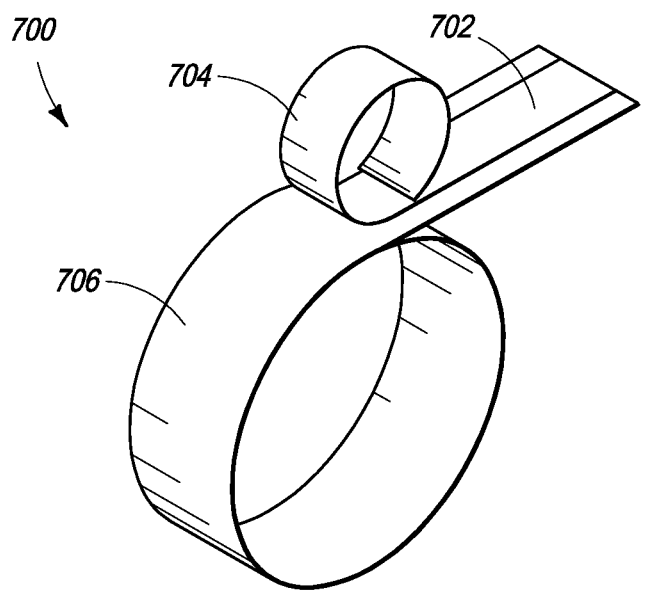
FIG. 15B is an isometric view depicting a second intermediate article of manufacture in the assembly of a bypass diode, according to aspects of the present teachings.
Figure 15C:
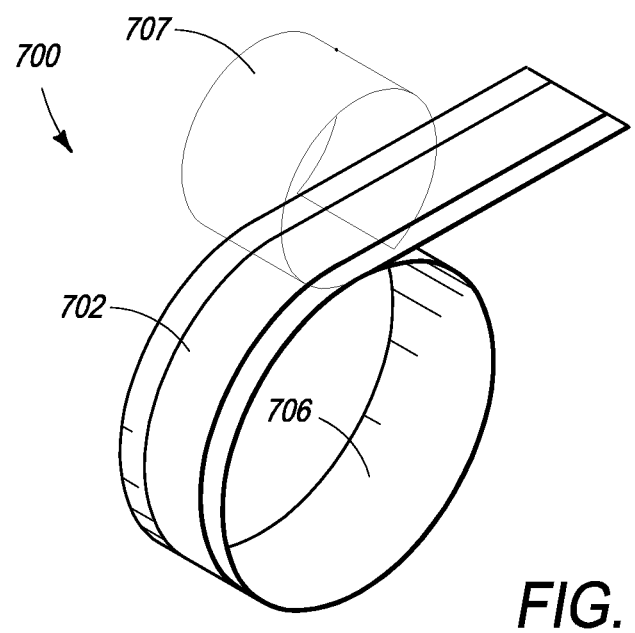
FIG. 15C is an isometric view depicting a third intermediate article of manufacture in the assembly of a bypass diode, according to aspects of the present teachings.
Figure 15D:
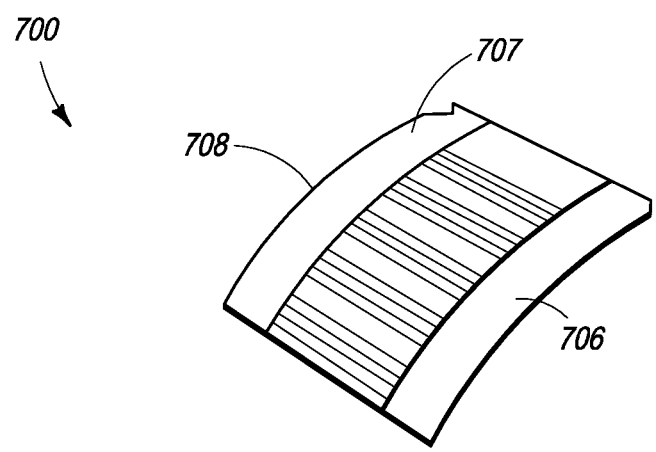
FIG. 15D is an isometric view depicting a substantially completely assembled bypass diode, according to aspects of the present teachings.

Specifically, FIG. 15A shows diode material 702, such as CIS-based semiconductor material on a stainless steel substrate, cut or slit into a relatively narrow reel, with conductive tape 704 being adhered to the back side (substrate side) of the material. This corresponds to the state of the diode assembly during step 658 of method 650. FIG. 15B shows diode material 702 and conductive tape 704 being adhered to a copper foil 706. This corresponds to the state of the diode assembly during step 660 of method 650. FIG. 15C shows another layer of conductive tape 707 being applied to the assembly of FIG. 15B, corresponding to the state of the diode assembly during step 662 of method 650. FIG. 15D shows the assembly of FIG. 15C after it has been cut or singulated into a thin film diode 708 with desired dimensions, corresponding to the state of the diode assembly after step 664 of method 650.

Alternative methods of constructing thin film bypass diodes, and incorporating them into photovoltaic modules, are also contemplated by the present teachings. For example, a continuous ribbon of CIS-based or CIGS-based thin film diode material could be manufactured as described previously, but assembled into bypass diodes and/or attached to adjacent photovoltaic cells in an alternative manner.

Figure 16:
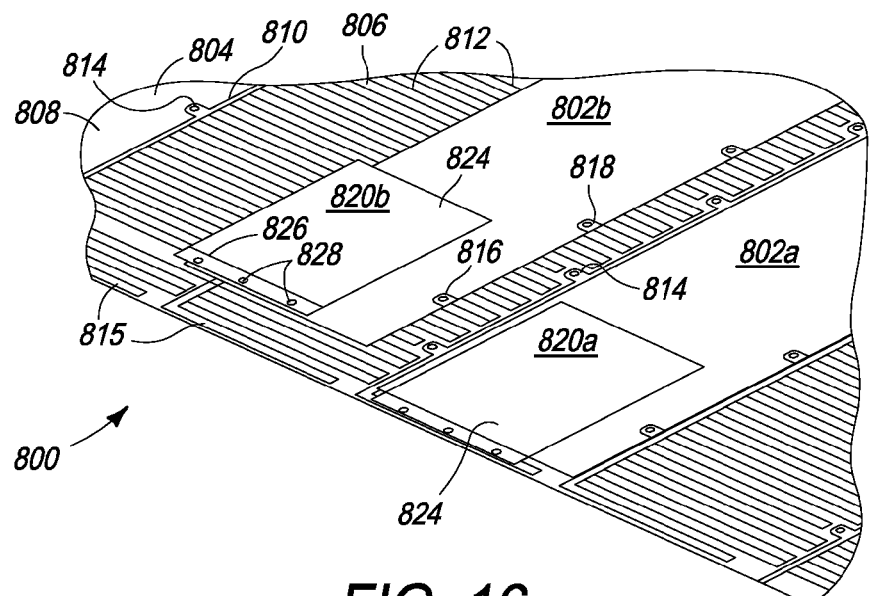
FIG. 16 is an isometric, partially exploded view showing bypass diodes being assembled to interconnected photovoltaic cells, according to aspects of the present teachings.
Figure 17:
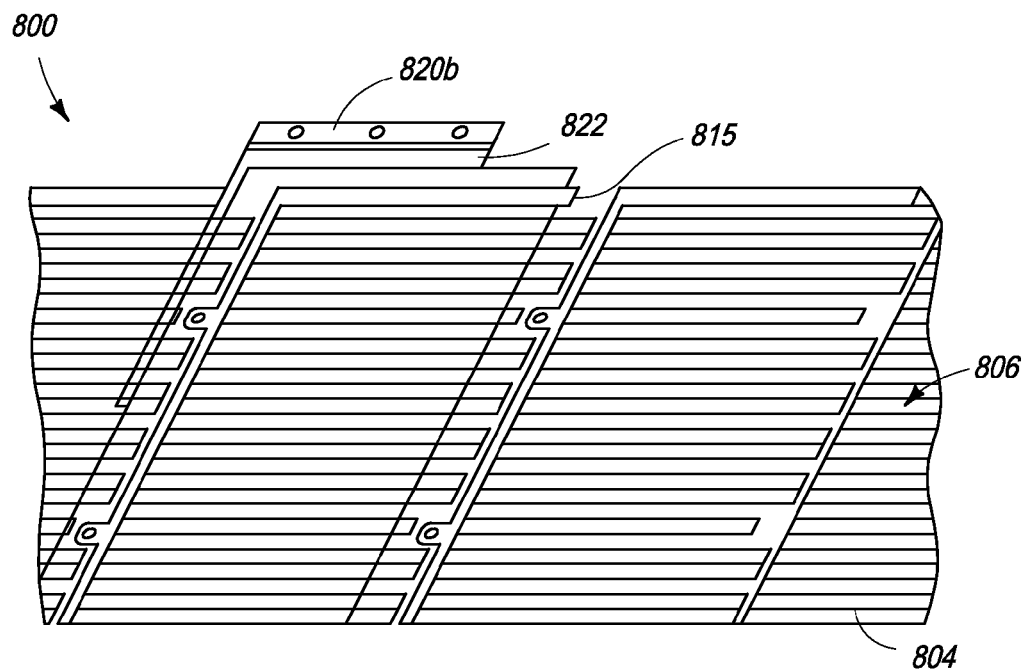
FIG. 17 is an isometric, partially exploded view of the assembly of FIG. 16, shown from the opposite side of the assembly.

FIGS. 16-17 depict a photovoltaic module, generally indicated at 800, which incorporates an alternatively connected bypass diode. In this example, a pair of photovoltaic cells 802a, 802b are electrically interconnected by a frontsheet 804, which includes a conductive grid pattern, generally indicated at 806, applied to one side of a substantially optically transparent planar sheet 808, such as a clear polymer material. Grid pattern 806 includes buss bars 810, grid lines 812 and interconnection tabs or pads 814, all of which are substantially similar to their counterparts in previously described examples, such as in grid pattern 88 of FIGS. 8A-8B and FIG. 9. However, grid pattern 806 in FIGS. 16-17 also includes buss bar extensions 815, each of which extends from one of the buss bars of the assembly. Buss bar extensions 815 are used to connect bypass diodes to the cells, as described below.

Cells 802a and 802b are positioned so that they are electrically interconnected in series by the grid pattern, as described previously. Specifically, interconnection areas 816 of cell 802b may be laser welded to interconnection tabs 814 of the grid pattern, as indicated by weld circles 818, to electrically connect the back side of cell 802b to the front side of cell 802a.

Assembly 800 also includes bypass diodes 820a, 820b, each of which is attached to a respective one of cells 802a, 802b. Each bypass diode includes a suitably modified thin-film semiconductor material 822 (as described previously) disposed upon a substrate 824 of stainless steel or some other suitable conductive material. Considering the concrete example of bypass diode 820b in FIGS. 16-17, the front or semiconductor side of diode 820b is placed into electrical contact with the back or substrate side of corresponding cell 802b, establishing the cathode of the diode. The diode extends beyond the edge of the cell to the associated buss bar extension 815.

A portion of diode 820b overlapping the buss bar extension is electrically isolated from the portion of the diode overlapping cell 802b by a scribe line 826 across the width of the diode, which penetrates to the diode substrate. The portion of the diode overlapping the buss bar extension is then laser welded to the buss bar extension, which modifies, obliterates or otherwise penetrates the semiconductor material of the diode and forms an electrical connection between the substrate or back side of the diode and the buss bar extension, as indicated at weld circles 828. Because the buss bar extension is a portion of grid pattern 806, it is electrically connected to the front or "sunny" side of cell 802b. Accordingly, the back side of diode 820b is electrically connected to the front side of cell 802b, establishing the anode of the diode. Diode 820a would be electrically connected to cell 802a in precisely the same manner. According to the present teachings, the bypass diodes may be conveniently laminated to the backside of the cells at the "prelaminate" stage.

While the concepts discussed above have been described primarily in the context of flexible substrates having thin film CIGS photovoltaic layers, it should be understood that many of the concepts may also be readily used advantageously with other thin film devices and processes, for example, based on cadmium telluride, as well as rigid silicon based photovoltaic devices.

The various structural members disclosed herein may be constructed from any suitable material, or combination of materials, such as metal, plastic, nylon, rubber, or any other materials with sufficient structural strength to withstand the loads incurred during use. Materials may be selected based on their durability, flexibility, weight, and/or aesthetic qualities.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A method of manufacturing a photovoltaic module, comprising:
   applying a photoactive composition to a top side of a conductive substrate to produce a continuous sheet of photovoltaic material;
   removing sections of the photoactive composition from the photovoltaic material to create a plurality of interconnection areas that are electrically isolated from the photoactive composition disposed outside the interconnection areas;

cutting the photovoltaic material, including the conductive substrate, into first and second discrete, physically separate photoactive cells;

placing the cells in contact with an optically transmissive top sheet and thereby placing a conductive grid pattern of the top sheet into electrical contact with portions of the photoactive composition of each cell, including portions of the photoactive composition of the first cell within the interconnection areas; and electrically interconnecting the cells by converting a portion of the photoactive composition within each interconnection area into material having low ohmic resistance, thus electrically connecting a portion of the grid pattern in electrical contact with the photoactive composition of the second cell to portions of the substrate located within the interconnection areas of the first cell;

wherein converting a portion of the photoactive composition within each interconnection area into material having low ohmic resistance includes laser welding the top sheet to a portion of each interconnection area, and wherein laser welding includes directing a laser to impinge first on a back side of the substrate of the first cell.

2. The method of claim 1, wherein removing sections of the photoactive composition from the photovoltaic material includes laser scribing a perimeter portion of each interconnection area.

3. The method of claim 2, further comprising laser scribing a perimeter portion of each cell.

4. The method of claim 1, wherein applying the discrete cells to the top sheet includes leaving an exposed area of each cell extending beyond the grid pattern.

5. The method of claim 1, wherein the top sheet includes an adhesive layer disposed upon a structural layer.

6. The method of claim 1, wherein the photoactive composition includes a p-type semiconductor layer formed of cadmium indium gallium diselenide (CIGS), and an n-type semiconductor layer formed of cadmium sulfide (CdS).

* * * * *